(12) United States Patent
Chung et al.

(10) Patent No.: US 12,245,465 B2
(45) Date of Patent: Mar. 4, 2025

(54) ORGANIC LIGHT EMITTING DISPLAY DEVICE

(71) Applicant: Samsung Display Co., LTD., Yongin-si (KR)

(72) Inventors: Jinkoo Chung, Suwon-si (KR); Sungchul Kim, Seongnam-si (KR); Beohmrock Choi, Seoul (KR); Gunwoo Ko, Seoul (KR); Seongmin Cho, Seongnam-si (KR); Joonhoo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 802 days.

(21) Appl. No.: 17/280,847

(22) PCT Filed: Jan. 15, 2019

(86) PCT No.: PCT/KR2019/000580
§ 371 (c)(1),
(2) Date: Mar. 26, 2021

(87) PCT Pub. No.: WO2020/067611
PCT Pub. Date: Apr. 2, 2020

(65) Prior Publication Data
US 2021/0408182 A1  Dec. 30, 2021

(30) Foreign Application Priority Data

Sep. 28, 2018 (KR) .................. 10-2018-0116624

(51) Int. Cl.
*H10K 59/122* (2023.01)
*G06V 20/10* (2022.01)
*H10K 59/124* (2023.01)

(52) U.S. Cl.
CPC .......... *H10K 59/122* (2023.02); *G06V 20/10* (2022.01); *H10K 59/124* (2023.02)

(58) Field of Classification Search
CPC .... H10K 59/10; H10K 59/12; H10K 59/1201; H10K 59/121; H10K 59/1213;
(Continued)

(56) References Cited

U.S. PATENT DOCUMENTS 10,044,002 B2   8/2018   Lee et al.
11,152,433 B2   10/2021  Liu
(Continued)

FOREIGN PATENT DOCUMENTS

CN   107025875 A   8/2017
CN   107194321 A   9/2017
(Continued)

OTHER PUBLICATIONS

European Search Report for EP Patent Application No. 19864720.8 dated May 25, 2022, 10 pages.
(Continued)

*Primary Examiner* — Julio J Maldonado
*Assistant Examiner* — Stanetta D Isaac
(74) *Attorney, Agent, or Firm* — Lewis Roca Rothgerber Christie LLP

(57) ABSTRACT

An organic light emitting display device includes: a display panel configured to display an image on a first surface of the display panel, and including: a first display area including a first sub-pixel area, and having a first resolution; and a second display area including a second sub-pixel area and a first transmission area, and having a second resolution that is lower than the first resolution; and a first optical sensor on a second surface of the display panel opposite to the first
(Continued)

surface to overlap with the second display area. Accordingly, an image may be displayed at a portion where the first optical module is disposed.

32 Claims, 25 Drawing Sheets

(58) Field of Classification Search
CPC .. H10K 59/122; H10K 59/123; H10K 59/124; H10K 59/127; H10K 59/1275; H10K 59/30; H10K 59/35; H10K 59/351; H10K 59/13; H10K 39/34; H10K 59/128; H10K 59/176; H01L 31/12; H01L 31/125; H01L 31/153; H01L 31/173
See application file for complete search history.

(56) References Cited

U.S. PATENT DOCUMENTS

| | | | |
|---|---|---|---|
| 2017/0070679 A1 | 3/2017 | Chung et al. | |
| 2017/0212613 A1 | 7/2017 | Hwang et al. | |
| 2017/0213873 A1* | 7/2017 | Bok | H10K 59/1213 |
| 2017/0214003 A1 | 7/2017 | Lee et al. | |
| 2017/0277219 A1 | 9/2017 | Chung et al. | |
| 2017/0287992 A1 | 10/2017 | Kwak et al. | |
| 2017/0355313 A1 | 12/2017 | Park et al. | |
| 2018/0198067 A1* | 7/2018 | Kim | H10K 71/166 |
| 2019/0326366 A1 | 10/2019 | Fan et al. | |
| 2019/0393286 A1 | 12/2019 | Ding et al. | |
| 2020/0019747 A1 | 1/2020 | Yang et al. | |
| 2020/0051497 A1 | 2/2020 | Kang et al. | |
| 2020/0098308 A1* | 3/2020 | Li | G02F 1/133514 |
| 2021/0280648 A1 | 9/2021 | Choi et al. | |
| 2021/0359053 A1 | 11/2021 | Shan et al. | |

FOREIGN PATENT DOCUMENTS

| | | | |
|---|---|---|---|
| CN | 207264695 U | 4/2018 | |
| CN | 108269840 A | 7/2018 | |
| CN | 108376696 A | 8/2018 | |
| CN | 108461521 A | 8/2018 | |
| CN | 108520888 A | 9/2018 | |
| JP | 2010-230797 A | 10/2010 | |
| KR | 10-1156435 B1 | 6/2012 | |
| KR | 10-1462351 B1 | 11/2014 | |
| KR | 10-2015-0064337 A | 6/2015 | |
| KR | 10-2017-0024182 A | 3/2017 | |
| KR | 10-2017-0066767 A | 6/2017 | |
| KR | 10-2017-0087635 A | 7/2017 | |
| KR | 10-2017-0088457 A | 8/2017 | |
| KR | 10-2017-0141311 A | 12/2017 | |
| KR | 10-2018-0083459 A | 7/2018 | |

OTHER PUBLICATIONS

Taiwanese Office Action dated Aug. 16, 2023, issued in corresponding Taiwanese Patent Application No. 108123450 (11 pages).
International Search Report of corresponding Application No. PCT/KR2019/000580, dated Jun. 24, 2019, 4 pages.

* cited by examiner

FIG. 3
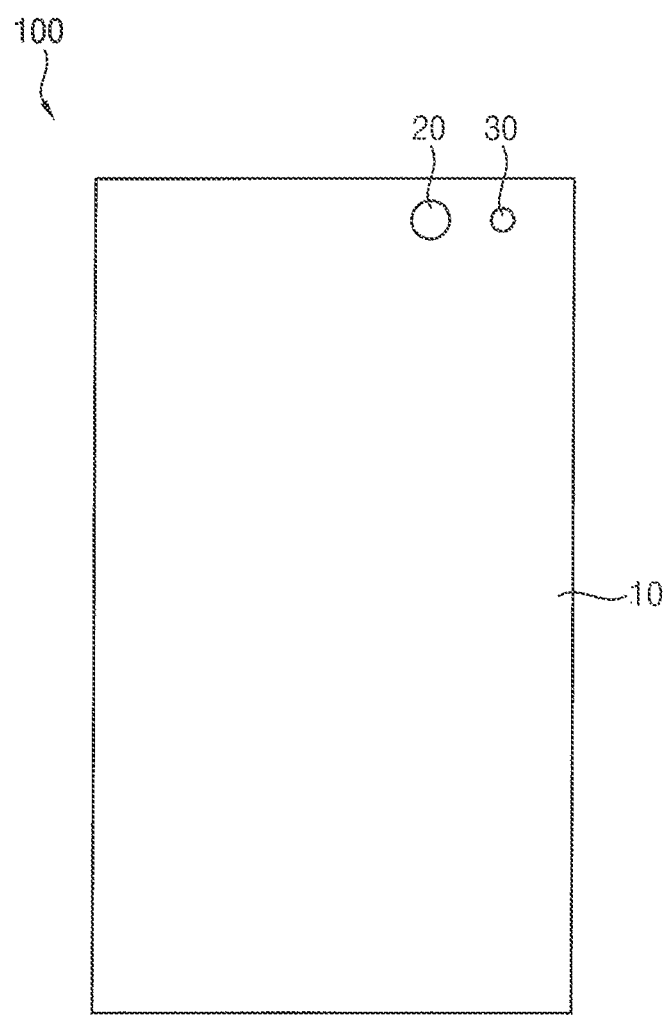
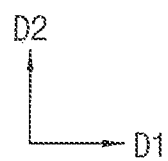

ORGANIC LIGHT EMITTING DISPLAY DEVICE

CROSS-REFERENCE TO RELATED APPLICATION

This application is a U.S. National Phase Patent Application of International Application No. PCT/KR2019/000580, filed on Jan. 15, 2019, which claims priority to Korean Patent Application No. 10-2018-0116624, filed on Sep. 28, 2018, the entire content of all of which is incorporated by reference herein.

TECHNICAL FIELD

Aspects of embodiments of the present disclosure relate generally to an organic light emitting display device. More particularly, aspects of embodiments of the present disclosure relate to an organic light emitting display device including an optical module.

BACKGROUND

Flat panel display devices are used as display devices for replacing a cathode ray tube display device due to light-weight and thin characteristics thereof. As representative examples of such flat panel display devices, there are a liquid crystal display device and an organic light emitting display device.

The organic light emitting display device may include a display area for displaying an image, and a non-display area. An optical module may be disposed in the non-display area. For example, the optical module may include: a camera module for capturing an image of an object located over a front surface of the organic light emitting display device; a face recognition sensor module for detecting a face of a user; a pupil recognition sensor module for detecting a pupil of the user; an acceleration sensor module and a geomagnetic sensor module for determining a movement of the organic light emitting display device; a proximity sensor module and an infrared sensor module for detecting a proximity of a body part or an object with respect to a front side of the organic light emitting display device, an illuminance sensor module for measuring a degree of brightness when the display device is left in a pocket or a bag; and/or the like. Because the optical modules are disposed in the non-display area of the organic light emitting display device, the image may not be displayed in a portion where the optical modules are disposed.

The above information disclosed in this Background section is for enhancement of understanding of the background of the present disclosure, and therefore, it may contain information that does not constitute prior art.

CONTENT OF THE INVENTION

Problem to be Solved

One or more embodiments of the present disclosure are directed to an organic light emitting display device including an optical module (e.g., an optical device).

However, the present disclosure is not limited thereto. Thus, the aspects, features, and objects of the present disclosure may be extended without departing from the spirit and the scope of the present disclosure.

Means for Solving the Problem

According to one or more embodiments of the present disclosure, an organic light emitting display device includes a display panel and a first optical module. The display panel includes a first display area and a second display area. The first display area includes a first sub-pixel area, and has a first resolution. The second display area includes a second sub-pixel area and a first transmission area, and has a second resolution that is lower than the first resolution. The display panel is configured to display an image on a first surface of the display panel. The first optical module is disposed on a second surface opposite to the first surface of the display panel to overlap with the second display area.

In one or more embodiments, the display panel may further include a first sub-pixel circuit and a second sub-pixel circuit. The first sub-pixel circuit may be disposed in the first display area. The second sub-pixel circuit may be disposed in the second display area, and may be different from the first sub-pixel circuit.

In one or more embodiments, the number of transistors constituting the first sub-pixel circuit may be greater than the number of transistors constituting the second sub-pixel circuit.

In one or more embodiments, the display panel may further include a first sub-pixel structure, a second sub-pixel structure, and a first transmission window. The first sub-pixel structure may be disposed in the first sub-pixel area on the first sub-pixel circuit, and may be electrically connected to the first sub-pixel circuit. The second sub-pixel structure may be disposed in the second sub-pixel area on the second sub-pixel circuit, and may be electrically connected to the second sub-pixel circuit. The first transmission window may be disposed in the first transmission area adjacent to the second sub-pixel area.

In one or more embodiments, the first optical module may include a camera module, and the first optical module may be configured to recognize an object located over the first surface of the display panel through the first transmission window.

In one or more embodiments, the second sub-pixel circuit may not be disposed in the first transmission area.

In one or more embodiments, the display panel may further include a third display area and a third sub-pixel circuit. The third display area may be adjacent to the second display area, and may include a third sub-pixel area and a second transmission area. The third display area may have a third resolution between the first resolution and the second resolution. The third sub-pixel circuit may be disposed in the third display area, and may be different from the first and second sub-pixel circuits.

In one or more embodiments, the number of transistors constituting the third sub-pixel circuit may be less than the number of transistors constituting the first sub-pixel circuit, and may be greater than the number of transistors constituting the second sub-pixel circuit.

In one or more embodiments, the organic light emitting display device may further include a second optical module disposed on the second surface of the display panel to overlap with the third display area.

In one or more embodiments, the display panel may further include a third sub-pixel structure and a second transmission window. The third sub-pixel structure may be disposed in the third sub-pixel area on the third sub-pixel circuit, and may be electrically connected to the third sub-pixel circuit. The second transmission window may be disposed in the second transmission area adjacent to the third sub-pixel area.

In one or more embodiments, the third sub-pixel circuit may not be disposed in the second transmission area.

In one or more embodiments, the second optical module may include at least one of a face recognition sensor module, a pupil recognition sensor module, an acceleration sensor module, a proximity sensor module, an infrared sensor module, or an illuminance sensor module.

In one or more embodiments, a size of the first optical module may be equal to a size of the second display area, and a size of the second optical module may be equal to a size of the third display area.

In one or more embodiments, an area of the first display area may be greater than an area of the second display area.

In one or more embodiments, the second display area may be located on one end of the first surface of the display panel, and the first display area may surround the second display area.

In one or more embodiments, the display panel may further include a first sub-pixel circuit disposed in the first display area, and a second sub-pixel circuit disposed in the second display area, and the first and second sub-pixel circuits may have the same configuration as each other.

According to one or more embodiments of the present disclosure, an organic light emitting display device includes a display panel and a first optical module. The display panel is configured to display an image on a first surface of the display panel, and includes a substrate, a first sub-pixel circuit, a second sub-pixel circuit, sub-pixel structures, a first transmission window. The substrate includes a first display area and a second display area. The first display area includes a first sub-pixel area, and is configured to display an image with a first resolution. The second display area includes a second sub-pixel area and a first transmission area, and is configured to display an image with a second resolution that is lower than the first resolution. The first sub-pixel circuit is disposed in the first display area on the substrate. The second sub-pixel circuit is disposed in the second display area on the substrate, and is configured to expose the first transmission area. The sub-pixel structures are disposed in the first sub-pixel area and the second sub-pixel area on the substrate. The first transmission window is formed in the first transmission area on the substrate. The first optical module is disposed on a second surface opposite to the first surface of the display panel to overlap with the second display area.

In one or more embodiments, the substrate may include a first groove formed in a portion of the second surface that overlaps with the second display area, and the first optical module may be embedded in the first groove.

In one or more embodiments, the organic light emitting display device may further include an insulating layer structure disposed on the substrate, a planarization layer disposed on the insulating layer structure, and a pixel defining layer disposed on the planarization layer.

In one or more embodiments, in the first transmission area, the insulating layer structure, the planarization layer, and the pixel defining layer may include a first opening that exposes the substrate, and the first opening may be defined as the first transmission window.

In one or more embodiments, the organic light emitting display device may further include a capping layer disposed on the pixel defining layer. The capping layer may have a first thickness in the first sub-pixel area, and may have a second thickness that is less than the first thickness in the second sub-pixel area and the first transmission area.

In one or more embodiments, the substrate may further include a third display area and a third sub-pixel circuit. The third display area may be adjacent to the second display area, and may include a third sub-pixel area and a second transmission area. The third display area may be configured to display an image with the second resolution. The third sub-pixel circuit may be disposed in the third display area, and may have the same configuration as that of the second sub-pixel circuit.

In one or more embodiments, the number of transistors constituting the third sub-pixel circuit may be equal to the number of transistors constituting the second sub-pixel circuit.

In one or more embodiments, the organic light emitting display device may further include a second optical module disposed on the second surface of the display panel to overlap with the third display area.

In one or more embodiments, the substrate may include a second groove formed in a portion of the second surface that overlaps with the third display area, and the second optical module may be embedded in the second groove.

In one or more embodiments, the substrate may further include a third sub-pixel structure and a second transmission window. The third sub-pixel structure may be disposed in the third sub-pixel area on the third sub-pixel circuit, and may be electrically connected to the third sub-pixel circuit. The second transmission window may be disposed in the second transmission area adjacent to the third sub-pixel area.

In one or more embodiments, the third sub-pixel circuit may not be disposed in the second transmission area.

In one or more embodiments, in the second transmission area, the insulating layer structure, the planarization layer, and the pixel defining layer may include a second opening that exposes the substrate, and the second opening may be defined as the second transmission window.

In one or more embodiments, the first sub-pixel circuit may have the same configuration as that of each of the second and third sub-pixel circuits, and a size of the first transmission window may be equal to a size of the second transmission window.

In one or more embodiments, a configuration of the second sub-pixel circuit may be different from a configuration of the third sub-pixel circuit, and a size of the first transmission window may be different from a size of the second transmission window.

In one or more embodiments, the number of transistors constituting the third sub-pixel circuit may be greater than the number of transistors constituting the second sub-pixel circuit.

In one or more embodiments, the size of the second transmission window may be less than the size of the first transmission window.

In one or more embodiments, each of the first and second sub-pixel circuits may include at least one semiconductor element and at least one capacitor.

In one or more embodiments, each of the sub-pixel structures may include a lower electrode disposed on the first and second sub-pixel circuits, a light emitting layer disposed on the lower electrode, and an upper electrode disposed on the light emitting layer.

In one or more embodiments, the upper electrode may not be disposed in the first transmission area.

According to one or more embodiments of the present disclosure, an organic light emitting display device includes a display panel, a first optical module, and a second optical module. The display panel includes a first display area, a second display area, and a non-display area. The first display area includes a first sub-pixel area, and has a first resolution. The second display area includes a second sub-pixel area and a first transmission area, and has a second resolution that is lower than the first resolution. The non-display area includes a second transmission area, and does not display an image. The display panel is configured to display an image on a first surface of the display panel. The first optical module is disposed on a second surface opposite to the first surface of the display panel to overlap with the non-display area. The second optical module is disposed on the second surface of the display panel to overlap with the second display area.

In one or more embodiments, the first optical module may include a camera module, and the first optical module may be configured to recognize an object located over the first surface of the display panel through the second transmission area.

In one or more embodiments, the second optical module may include at least one of a face recognition sensor module, a pupil recognition sensor module, an acceleration sensor module, a proximity sensor module, an infrared sensor module, or an illuminance sensor module.

Effects of the Invention

According to one or more embodiments of the present disclosure, because the organic light emitting display device may include the first display area having the first resolution, and the second and third display areas having the second resolution that is lower than the first resolution, an image may also be displayed at (e.g., in or on) a portion where the first optical module (e.g., the first optical device) and the second optical module (e.g., the second optical device) are disposed. In addition, because the organic light emitting display device may include the first transmission window and the second transmission window, the first optical module and the second optical module may detect a surrounding situation or may capture an image of an object located over the first surface of the display panel through the first transmission window and the second transmission window.

However, the aspects, features, and effects of the present disclosure are not limited thereto. Thus, the aspects, features, and effects of the present disclosure may be extended without departing from the spirit and the scope of the present disclosure.

BRIEF DESCRIPTION OF THE DRAWINGS

The above and other aspects and features of the present disclosure will become more apparent to those skilled in the art from the following detailed description of the embodiments with reference to the accompanying drawings.

FIG. 3 is a plan view showing a first display area, a second display area, and a third display area of the organic light emitting display device of FIG. 1.

PARTICULAR CONTENTS FOR IMPLEMENTING THE INVENTION

Hereinafter, organic light emitting display devices according to embodiments of the present disclosure will be described in more detail with reference to the accompanying drawings. In the accompanying drawings, the same or similar reference symbols are used throughout to refer to the same or substantially the same (or similar) components.

Figure 1:
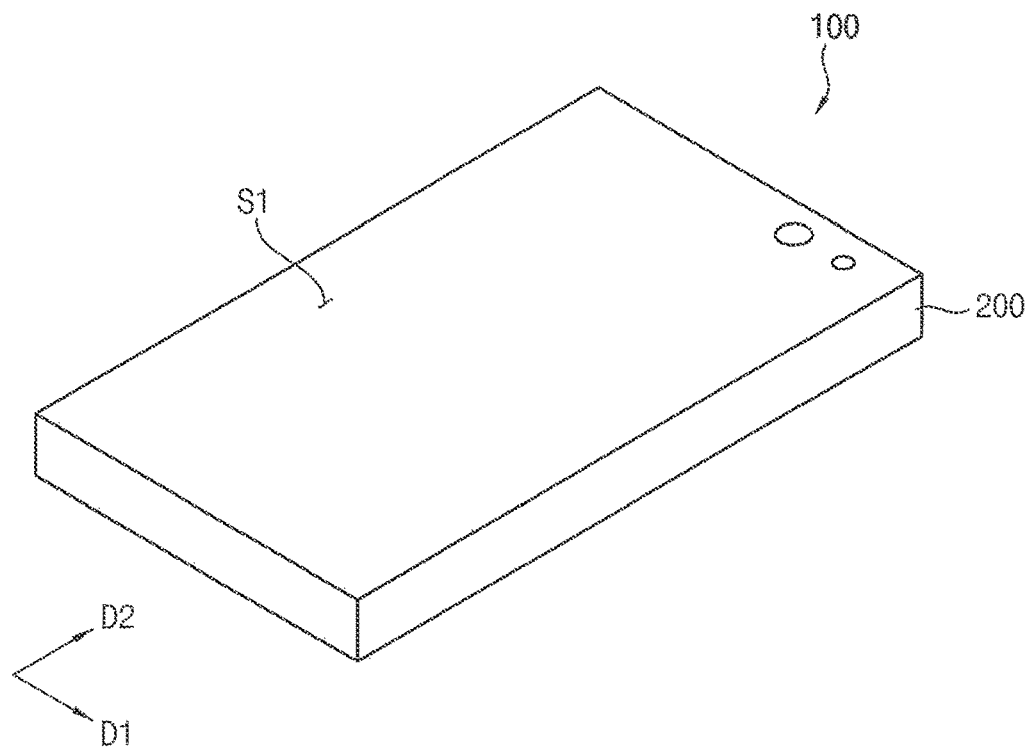
FIG. 1 is a perspective view showing an organic light emitting display device according to one or more embodiments of the present disclosure.
Figure 2:
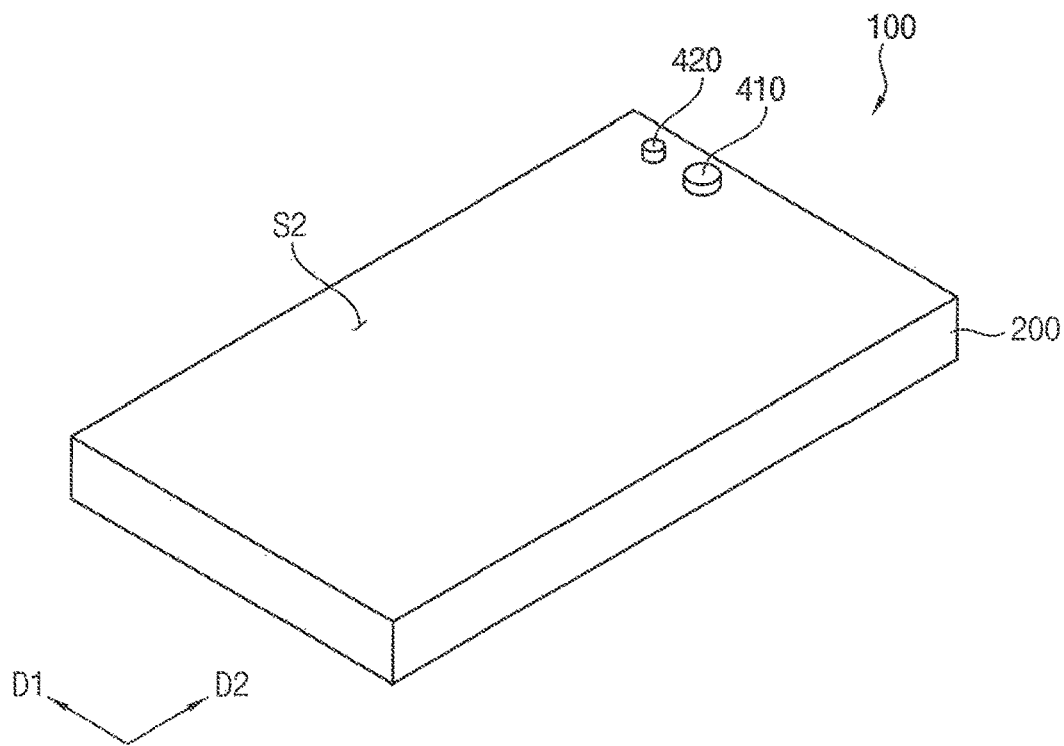
FIG. 2 is a perspective view showing an optical module disposed on a rear surface of the organic light emitting display device of FIG. 1.

FIG. 1 is a perspective view showing an organic light emitting display device according to one or more embodiments of the present disclosure, FIG. 2 is a perspective view showing an optical module disposed on a rear surface of the organic light emitting display device of FIG. 1, and FIG. 3 is a plan view showing a first display area, a second display area, and a third display area of the organic light emitting display device of FIG. 1.

Referring to FIGS. 1 to 3, an organic light emitting display device 100 may include a display panel 200, a first optical module (e.g., a first optical sensor or device) 410, a second optical module (e.g., a second optical sensor or device) 420, and the like. The display panel 200 may have a first surface S1 for displaying an image, and a second surface S2 opposite to the first surface S1. The first optical module 410 and the second optical module 420 may be disposed at (e.g., in or on) one side (e.g., at an end or at one end) of the second surface S2 of the display panel 200, and the first optical module 410 and the second optical module 420 may be adjacent to each other.

The display panel 200 may include a first display area 10, a second display area 20, and a third display area 30. In this case, each of the second and third display areas 20 and 30 may be located at (e.g., in or on) one side (e.g., at an end or at one end) of the first surface S1 of the display panel 200, and the second display area 20 and the third display area 30 may be adjacent to each other. In addition, the first display area 10 may surround (e.g., around peripheries of) the second display area 20 and the third display area 30, and an area of the first display area 10 may be greater than an area of each of the second and third display areas 20 and 30.

Figure 6:
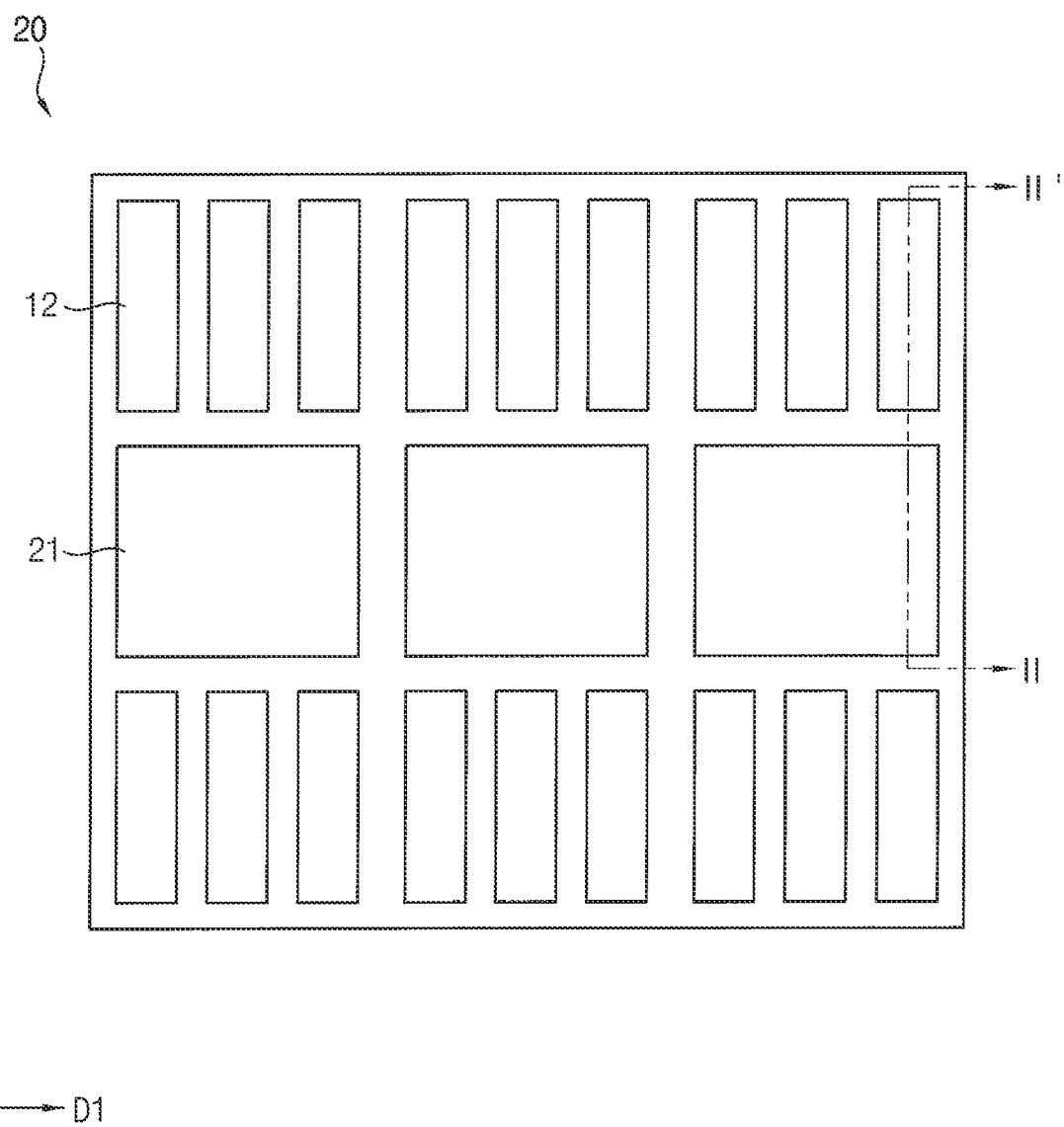
FIG. 6 is a partially enlarged plan view showing a part of the second display area of FIG. 3.
Figure 9:
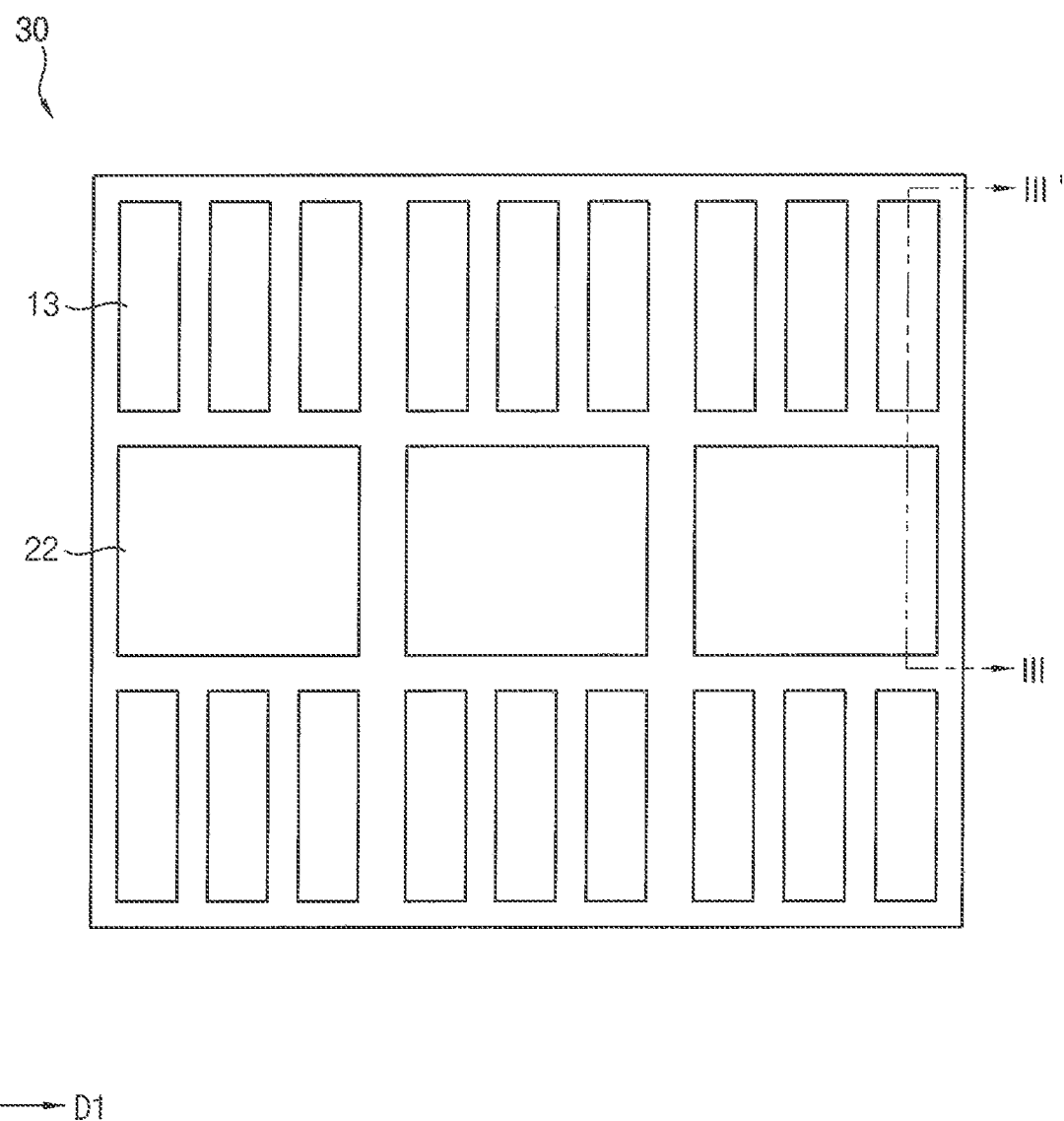
FIG. 9 is a partially enlarged plan view showing a part of the third display area of FIG. 3.

The first display area 10 may include a plurality of first sub-pixel areas (e.g., corresponding to a first sub-pixel area 11 of FIG. 4), the second display area 20 may include a plurality of second sub-pixel areas and a plurality of first transmission areas (e.g., corresponding to a second sub-pixel area 12 and a first transmission area 21 of FIG. 6), and the third display area 30 may include a plurality of third sub-pixel areas and a plurality of second transmission areas (e.g., corresponding to a third sub-pixel area 13 and a second transmission area 22 of FIG. 9). In one or more embodiments, the display panel 200 may display the image with different resolutions at (e.g., in or on) the first display area 10 and the second and third display areas 20 and 30. For example, the image may be displayed with a first resolution at (e.g., in or on) the first display area 10, and the image may be displayed with a second resolution that is lower than the first resolution at (e.g., in or on) the second and third display areas 20 and 30. In other words, the first display area 10 may have the first resolution, and each of the second and third display areas 20 and 30 may have the second resolution.

The first optical module 410 may be disposed on the second surface S2 of the display panel 200 to overlap with the second display area 20. In other words, a size of the second display area 20 may be equal to or substantially equal to a size of the first optical module 410. In other words, a shape of the second display area 20 may be defined according to a shape of the first optical module 410. The first optical module 410 may include, for example, a camera module (e.g., a camera, a camera sensor, or a camera device) for capturing (or for recognizing) an image of an object located over the first surface S1 of the display panel 200.

The second optical module 420 may be disposed on the second surface S2 of the display panel 200 to overlap with the third display area 30. In other words, a size of the third display area 30 may be equal to or substantially equal to a size of the second optical module 420. In other words, a shape of the third display area 30 may be defined according to a shape of the second optical module 420. The second optical module 420 may include, for example: a face recognition sensor module (e.g., a face recognition sensor or device) for detecting a face of a user; a pupil recognition sensor module (e.g., a pupil recognition sensor or device) for detecting a pupil of the user; an acceleration sensor module (e.g., an acceleration sensor or device) and a geomagnetic sensor module (e.g., a geomagnetic sensor or device) for determining a movement of the organic light emitting display device 100; a proximity sensor module (e.g., a proximity sensor or device) and an infrared sensor module (e.g., an infrared sensor or device) for detecting a proximity of the user's finger or an object with respect to a front side of the organic light emitting display device 100; an illuminance sensor module (e.g., an illuminance sensor or device) for measuring a degree of brightness when the display device 100 is left in a pocket or a bag; and/or the like.

Figure 4:
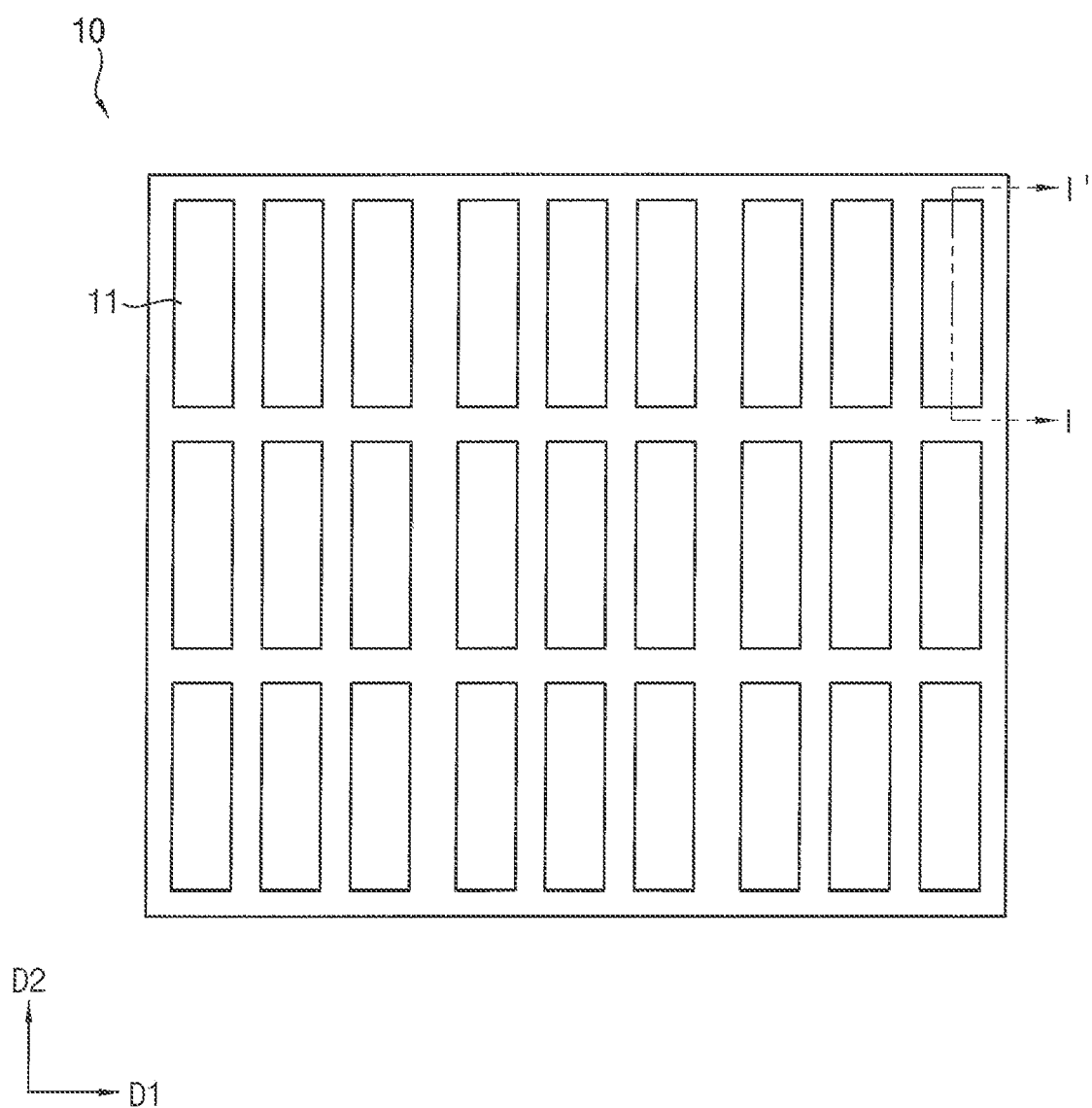
FIG. 4 is a partially enlarged plan view showing a part of the first display area of FIG. 3.
Figure 5:
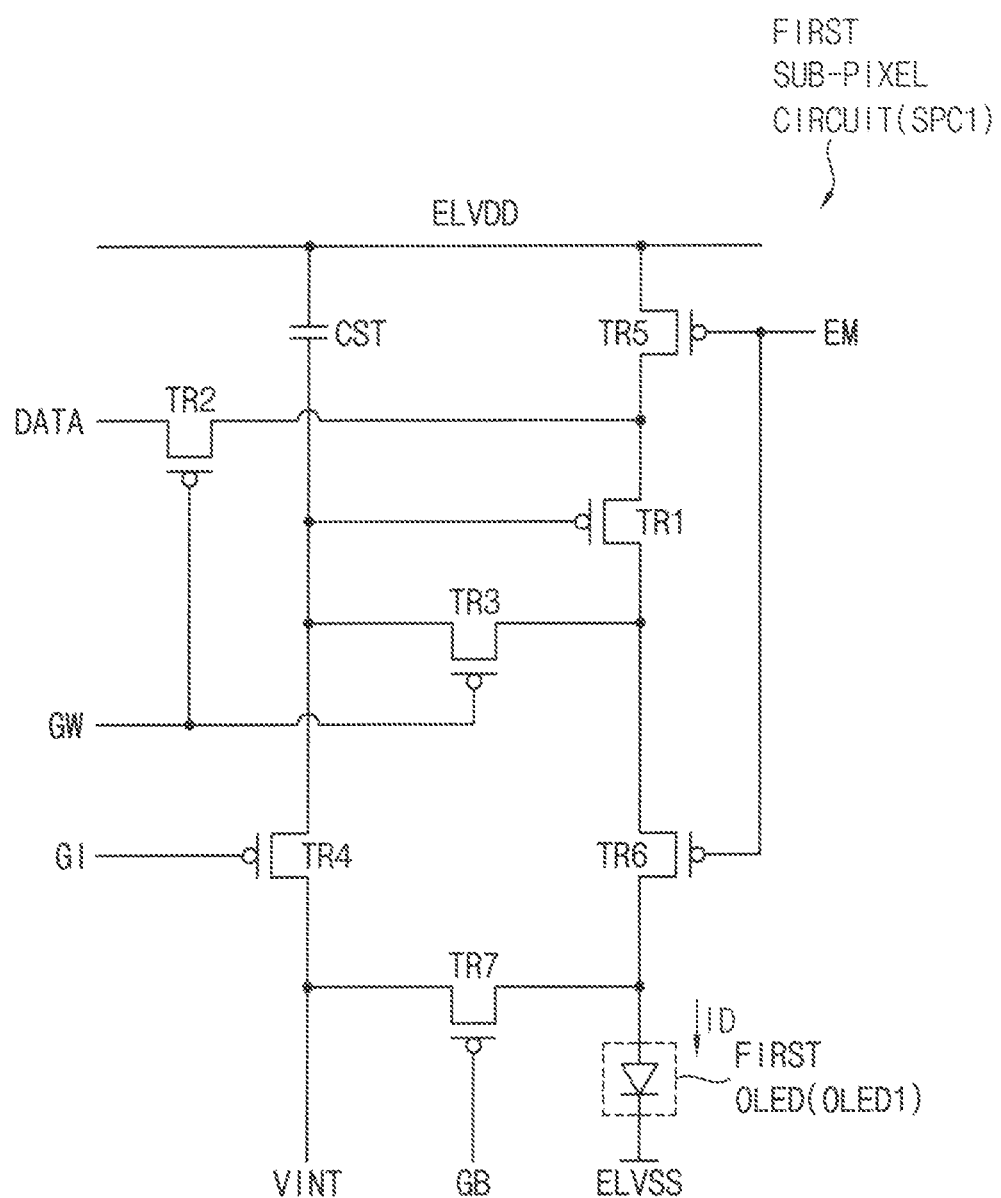
FIG. 5 is a circuit diagram showing a first sub-pixel circuit and a first organic light emitting diode disposed in the first display area of FIG. 4.

FIG. 4 is a partially enlarged plan view showing a part of the first display area of FIG. 3, and FIG. 5 is a circuit diagram showing a first sub-pixel circuit and a first organic light emitting diode disposed in the first display area of FIG. 4.

Referring to FIGS. 3, 4, and 5, the display panel 200 may further include first sub-pixel circuits SPC1, and first organic light emitting diodes OLED1. In addition, the display panel 200 may include the first display area 10, and the first display area 10 may include a plurality of first sub-pixel areas 11. For example, the first sub-pixel areas 11 may be arranged within the first display area 10 along a first direction D1 that is parallel to or substantially parallel to the first surface S1 of the display panel 200, and along a second direction D2 that is orthogonal to or substantially orthogonal to the first direction D1. In other words, the first sub-pixel areas 11 may be arranged over the whole (e.g., over an entirety of the) first display area 10.

Figure 11:
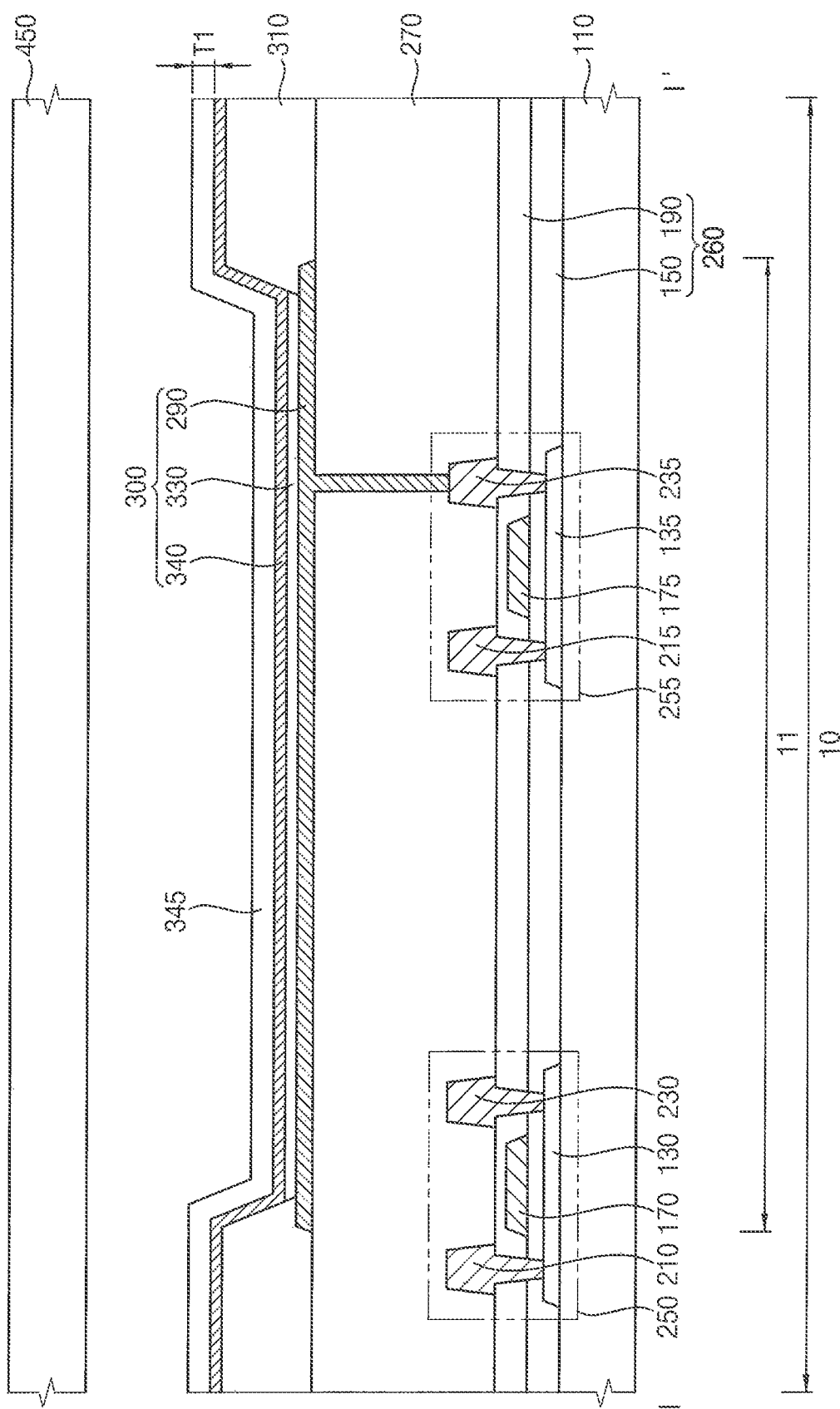
FIG. 11 is a cross-sectional view taken along the line I-I' of the organic light emitting display device of FIG. 4.

Each of the first sub-pixel circuits SPC1 may overlap with a corresponding first sub-pixel area 11, and the first organic light emitting diode OLED1 (e.g., corresponding to a first sub-pixel structure 300 of FIG. 11) may be disposed on the first sub-pixel circuit SPC1 (e.g., corresponding to a first semiconductor element 250 and a second semiconductor element 255 of FIG. 11). An image may be displayed at (e.g., in or on) the first sub-pixel area 11 through the first sub-pixel circuit SPC1 and the first organic light emitting diode OLED1. In some embodiments, the first sub-pixel circuit SPC1 may overlap with a part of the first sub-pixel area 11, and a part of another first sub-pixel area 11 that is different from the first sub-pixel area 11 (e.g., a part of other first sub-pixel areas 11 adjacent to the first sub-pixel area 11). In addition, the first organic light emitting diodes OLED1 may be arranged by using an RGB stripe scheme in which rectangular-shaped pixels having the same or substantially the same size as each other are sequentially arranged, an S-stripe scheme including a blue organic light emitting diode having a relatively larger area, a WRGB scheme further including a white organic light emitting diode, an RGBG matrix scheme (e.g., a PENTILE® scheme, PENTILE® being a duly registered trademark of Samsung Display Co. Ltd.) in which RG-GB patterns are repeatedly arranged, or the like.

However, although each of the first display area 10 and the first sub-pixel area 11 according to the present embodiment has been described as having a rectangular shape when viewed in a plan view (e.g., a view from a direction that is perpendicular to or substantially perpendicular to a top surface of the relevant element or layer), the shapes thereof are not limited thereto. For example, each of the first display area 10 and the first sub-pixel area 11 may have a triangular shape, a rhombic shape, a polygonal shape, a circular shape, a track shape, or an elliptical shape when viewed in the plan view.

As shown in FIG. 5, the first sub-pixel circuit SPC1 may include first to seventh transistors TR1, TR2, TR3, TR4, TR5, TR6, and TR7, a storage capacitor CST, a high power supply voltage (ELVDD) wire, a low power supply voltage (ELVSS) wire, an initialization voltage (VINT) wire, a data signal (DATA) wire, a gate signal (GW) wire, a gate initialization signal (GI) wire, an emission control signal (EM) wire, a diode initialization signal (GB) wire, and the like. In addition, the first sub-pixel circuit SPC1 and the first organic light emitting diode OLED1 may be electrically connected to each other.

The first organic light emitting diode OLED1 (e.g., corresponding to the first sub-pixel structure 300 of FIG. 11) may output light based on a driving current ID. The first organic light emitting diode OLED1 may include a first terminal and a second terminal. The second terminal of the first organic light emitting diode OLED1 may receive the low power supply voltage ELVSS. For example, the first terminal of the first organic light emitting diode OLED1 may be an anode terminal, and the second terminal of the first organic light emitting diode OLED1 may be a cathode terminal. In some embodiments, the first terminal of the first organic light emitting diode OLED1 may be a cathode terminal, and the second terminal of the first organic light emitting diode OLED1 may be an anode terminal. In the present embodiment, the anode terminal of the first organic light emitting diode OLED1 may correspond to a first lower electrode 290 of FIG. 11, and the cathode terminal of the first organic light emitting diode OLED1 may correspond to a first upper electrode 340 of FIG. 11.

The first transistor TR1 (e.g., corresponding to a first semiconductor element 250 of FIG. 11) may include a gate terminal, a first terminal, and a second terminal. In the present embodiment, the first terminal of the first transistor TR1 may be a source terminal, and the second terminal of the first transistor TR1 may be a drain terminal. In some embodiments, the first terminal of the first transistor TR1 may be a drain terminal, and the second terminal of the first transistor TR1 may be a source terminal.

The first transistor TR1 may generate the driving current ID. In the present embodiment, the first transistor TR1 may operate in a saturation region. In this case, the first transistor TR1 may generate the driving current ID based on a voltage difference between the gate terminal and the source terminal thereof. In addition, gray levels may be expressed based on a magnitude of the driving current ID supplied to the first organic light emitting diode OLED1. In some embodiments, the first transistor TR1 may operate in a linear region. In this case, the gray levels may be expressed based on a sum of a time during which the driving current is supplied to the organic light emitting diode within one frame.

The second transistor TR2 may include a gate terminal, a first terminal, and a second terminal. The gate terminal of the second transistor TR2 may receive the gate signal GW. The first terminal of the second transistor TR2 may receive the data signal DATA. The second terminal of the second transistor TR2 may be connected to the first terminal of the first transistor TR1. In the present embodiment, the first terminal of the second transistor TR2 may be a source terminal, and the second terminal of the second transistor TR2 may be a drain terminal. In some embodiments, the first terminal of the second transistor TR2 may be a drain terminal, and the second terminal of the second transistor TR2 may be a source terminal.

The second transistor TR2 may supply the data signal DATA to the first terminal of the first transistor TR1 during an activation period of the gate signal GW. In this case, the second transistor TR2 may operate in a linear region.

The third transistor TR3 may include a gate terminal, a first terminal, and a second terminal. The gate terminal of the third transistor TR3 may receive the gate signal GW. The first terminal or the third transistor TR3 may be connected to the gate terminal of the first transistor TR1. The second terminal of the third transistor TR3 may be connected to the second terminal of the first transistor TR1. In the present embodiment, the first terminal of the third transistor TR3 may be a source terminal, and the second terminal of the third transistor TR3 may be a drain terminal. In some embodiments, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 during the activation period of the gate signal GW. In this case, the third transistor TR3 may operate in a linear region. In other words, the third transistor TR3 may diode-connect the first transistor TR1 during the activation period of the gate signal GW. Because the first transistor TR1 is diode-connected, a voltage difference corresponding to a threshold voltage of the first transistor TR1 may be generated between the first terminal of the first transistor TR1 and the gate terminal of the first transistor TR1. As a result, a voltage obtained by adding the voltage difference (e.g., the threshold voltage) to a voltage of the data signal DATA supplied to the first terminal of the first transistor TR1 may be supplied to the gate terminal of the first transistor TR1 during the activation period of the gate signal GW. In other words, the data signal DATA may be compensated for by the threshold voltage of the first transistor TR1, and the compensated data signal DATA may be supplied to the gate terminal of the first transistor TR1. As the threshold voltage compensation is performed, a driving current non-uniformity problem caused by a deviation of the threshold voltage of the first transistor TR1 may be solved.

An input terminal of the initialization voltage wire to which the initialization voltage VINT is provided may be connected to a first terminal of the fourth transistor TR4 and a first terminal of the seventh transistor TR7, and an output terminal of the initialization voltage wire may be connected to a second terminal of the fourth transistor TR4 and a first terminal of the storage capacitor CST.

The fourth transistor TR4 may include a gate terminal, the first terminal, and the second terminal. The gate terminal of the fourth transistor TR4 may receive the gate initialization signal GI. The first terminal of the fourth transistor TR4 may receive the initialization voltage VINT. The second terminal of the fourth transistor TR4 may be connected to the gate terminal of the first transistor TR1. In the present embodiment, the first terminal of the fourth transistor TR4 may be a source terminal, and the second terminal of the fourth transistor TR4 may be a drain terminal. In some embodiments, the first terminal of the fourth transistor TR4 may be a drain terminal, and the second terminal of the fourth transistor TR4 may be a source terminal.

The fourth transistor TR4 may supply the initialization voltage VINT to the gate terminal of the first transistor TR1 during an activation period of the gate initialization signal GI. In this case, the fourth transistor TR4 may operate in a linear region. In other words, the fourth transistor TR4 may initialize the gate terminal of the first transistor TR1 to the initialization voltage VINT during the activation period of the gate initialization signal GI. In the present embodiment, the initialization voltage VINT may have a voltage level that is sufficiently lower than a voltage level of the data signal DATA that is maintained or substantially maintained by the storage capacitor CST in a previous frame, and the initialization voltage VINT may be supplied to the gate terminal of the first transistor TR1, which may be a P-channel metal oxide semiconductor (PMOS) transistor. In other embodiments, the initialization voltage may have a voltage level that is sufficiently higher than the voltage level of the data signal DATA that is maintained or substantially maintained by the storage capacitor CST in the previous frame, and the initialization voltage may be supplied to the gate terminal of the first transistor, which may be an N-channel metal oxide semiconductor (NMOS) transistor.

In the present embodiment, the gate initialization signal GI may be a signal that is the same or substantially the same as the gate signal GW of one previous horizontal time. For example, the gate initialization signal GI supplied to the sub-pixel circuits of an $n^{th}$ row (where n is an integer greater than or equal to 2) from among a plurality of the sub-pixel circuits included in the organic light emitting display device 100 may be a signal that is the same or substantially the same as the gate signal GW supplied to the sub-pixel circuits of an $(n-1)^{th}$ row from among the sub-pixel circuits. In other words, an activated gate initialization signal GI may be supplied to first sub-pixel circuits SPC1 of the $n^{th}$ row from among the first sub-pixel circuits SPC1 by supplying an activated gate signal GW to the first sub-pixel circuits SPC1 of the $(n-1)^{th}$ row from among the first sub-pixel circuits SPC1. As a result, while the data signal DATA is supplied to the sub-pixel circuits in the $(n-1)^{th}$ row from among the sub-pixel circuits, the gate terminal of the first transistor TR1 included in the sub-pixel circuits of the $n^{th}$ row from among the first sub-pixel circuits SPC1 may be initialized to the initialization voltage VINT.

The fifth transistor TR5 may include a gate terminal, a first terminal, and a second terminal. The gate terminal may receive the emission control signal EM. The first terminal may be connected to the high power supply voltage (ELVDD) wire. The second terminal may be connected to the first terminal of the first transistor TR1. In the present embodiment, the first terminal of the fifth transistor TR5 may be a source terminal, and the second terminal of the fifth transistor TR5 may be a drain terminal. In some embodiments, the first terminal of the fifth transistor TR5 may be a drain terminal, and the second terminal of the fifth transistor TR5 may be a source terminal.

The fifth transistor TR5 may supply the high power supply voltage ELVDD to the first terminal of the first transistor TR1 during an activation period of the emission control signal EM. On the other hand, the fifth transistor TR5 may cut off the supply of the high power supply voltage ELVDD during an inactivation period of the emission control signal EM. In this case, the fifth transistor TR5 may operate in a linear region. Because the fifth transistor TR5 supplies the high power supply voltage ELVDD to the first terminal of the first transistor TR1 during the activation period of the emission control signal EM, the first transistor TR1 may generate the driving current ID. In addition, because the fifth transistor TR5 cuts off the supply of the high power supply voltage ELVDD during the inactivation period of the emission control signal EM, the data signal DATA supplied to the first terminal of the first transistor TR1 may be supplied to the gate terminal of the first transistor TR1.

The sixth transistor TR6 (e.g., corresponding to the second semiconductor element 255 of FIG. 11) may include a gate terminal, a first terminal, and a second terminal. The gate terminal may receive the emission control signal EM. The first terminal may be connected to the second terminal of the first transistor TR1. The second terminal may be connected to the first terminal of the first organic light emitting diode OLED1. In the present embodiment, the first terminal of the sixth transistor TR6 may be a source terminal, and the second terminal of the sixth transistor TR6 may be a drain terminal. In some embodiments, the first terminal of the sixth transistor TR6 may be a drain terminal, and the second terminal of the sixth transistor TR6 may be a source terminal.

The sixth transistor TR6 may supply the driving current ID generated by the first transistor TR1 to the first organic light emitting diode OLED1 during the activation period of the emission control signal EM. In this case, the sixth transistor TR6 may operate in a linear region. In other words, because the sixth transistor TR6 supplies the driving current ID generated by the first transistor TR1 to the first organic light emitting diode OLED1 during the activation period of the emission control signal EM, the first organic light emitting diode OLED1 may output light. In addition, because the sixth transistor TR6 electrically separates (e.g., electrically disconnects) the first transistor TR1 from the first organic light emitting diode OLED1 during the inactivation period of the emission control signal EM, the data signal DATA supplied to the second terminal of the first transistor TR1 (e.g., the data signal that has been subject to the threshold voltage compensation) may be supplied to the gate terminal of the first transistor TR1.

The seventh transistor TR7 may include a gate terminal, a first terminal, and a second terminal. The gate terminal may receive the diode initialization signal GB. The first terminal may receive the initialization voltage VINT. The second terminal may be connected to the first terminal of the first organic light emitting diode OLED1. In the present embodiment, the first terminal of the seventh transistor TR7 may be a source terminal, and the second terminal of the seventh transistor TR7 may be a drain terminal. In some embodiments, the first terminal of the seventh transistor TR7 may be a drain terminal, and the second terminal of the seventh transistor TR7 may be a source terminal.

The seventh transistor TR7 may supply the initialization voltage VINT to the first terminal of the first organic light emitting diode OLED1 during an activation period of the diode initialization signal GB. In this case, the seventh transistor TR7 may operate in a linear region. In other words, the seventh transistor TR7 may initialize the first terminal of the first organic light emitting diode OLED1 to the initialization voltage VINT during the activation period of the diode initialization signal GB.

In some embodiments, the gate initialization signal GI and the diode initialization signal GB may be the same or substantially the same signal. An operation of initializing the gate terminal of the first transistor TR1 and an operation of initializing the first terminal of the first organic light emitting diode OLED1 may not affect each other. In other words, the operation of initializing the gate terminal of the first transistor TR1 and the operation of initializing the first terminal of the first organic light emitting diode OLED1 may be independent from each other. Accordingly, the diode initialization signal GB may not be separately generated, so that economic efficiency of processes may be improved.

The storage capacitor CST may include a first terminal and a second terminal. The storage capacitor CST may be connected between the high power supply voltage (ELVDD) wire and the gate terminal of the first transistor TR1. For example, the first terminal of the storage capacitor CST may be connected to the gate terminal of the first transistor TR1, and the second terminal of the storage capacitor CST may be connected to the high power supply voltage (ELVDD) wire. The storage capacitor CST may maintain or substantially maintain a voltage level of the gate terminal of the first transistor TR1 during an inactivation period of the gate signal GW. The inactivation period of the gate signal GW may include (e.g., may overlap with) the activation period of the emission control signal EM, and the driving current ID generated by the first transistor TR1 may be supplied to the first organic light emitting diode OLED1 during the activation period of the emission control signal EM. Therefore, the driving current ID generated by the first transistor TR1 based on the voltage level maintained or substantially maintained by the storage capacitor CST may be supplied to the first organic light emitting diode OLED1.

However, although the first sub-pixel circuit SPC1 according to the present embodiment has been described above as including seven transistors and one storage capacitor, the configuration of the first sub-pixel circuit SPC1 according to various embodiments of the present disclosure is not limited thereto. For example, the first sub-pixel circuit SPC1 may have a configuration including at least one transistor and at least one storage capacitor.

Figure 7:
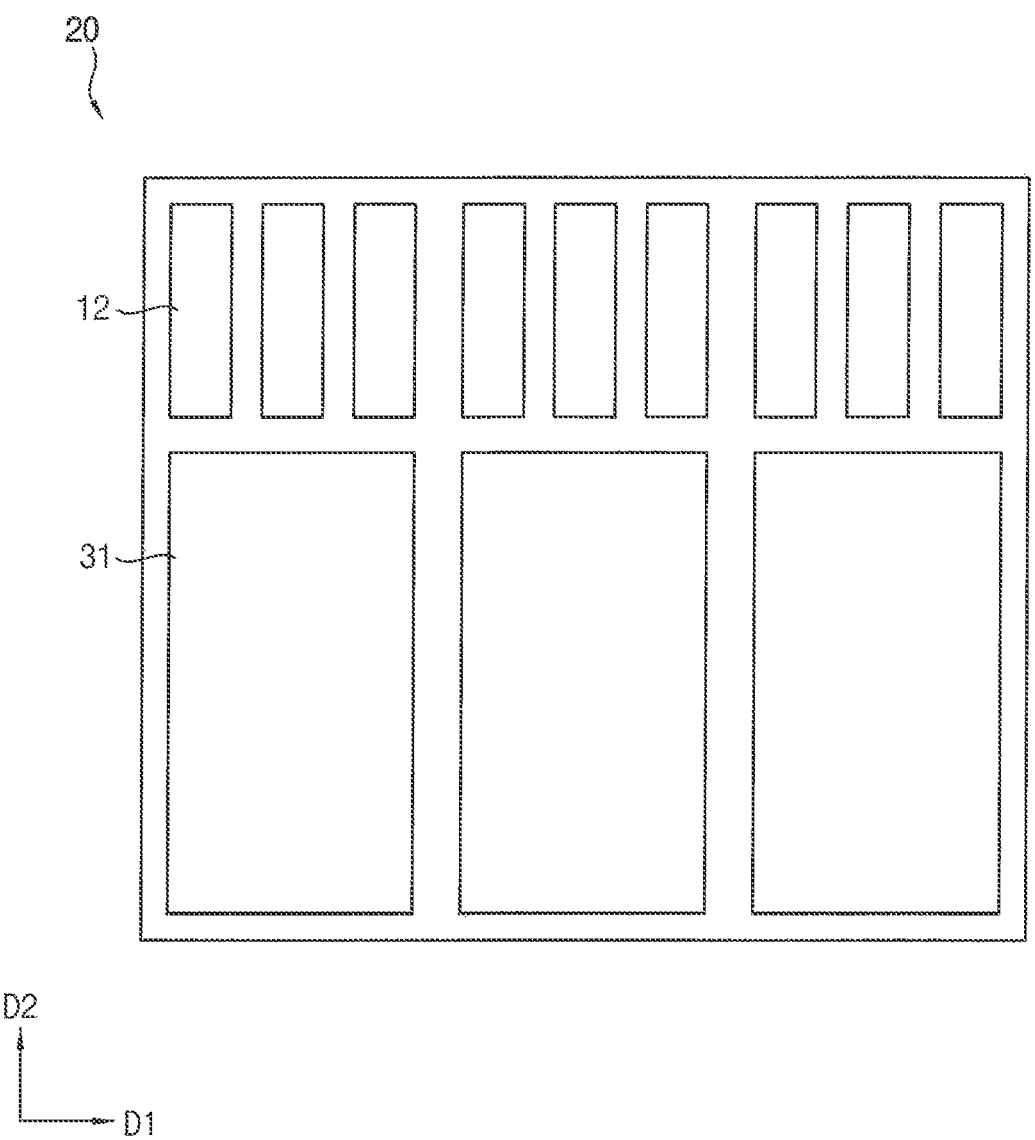
FIG. 7 is a partially enlarged plan view showing an example of the second display area of FIG. 3.
Figure 8:
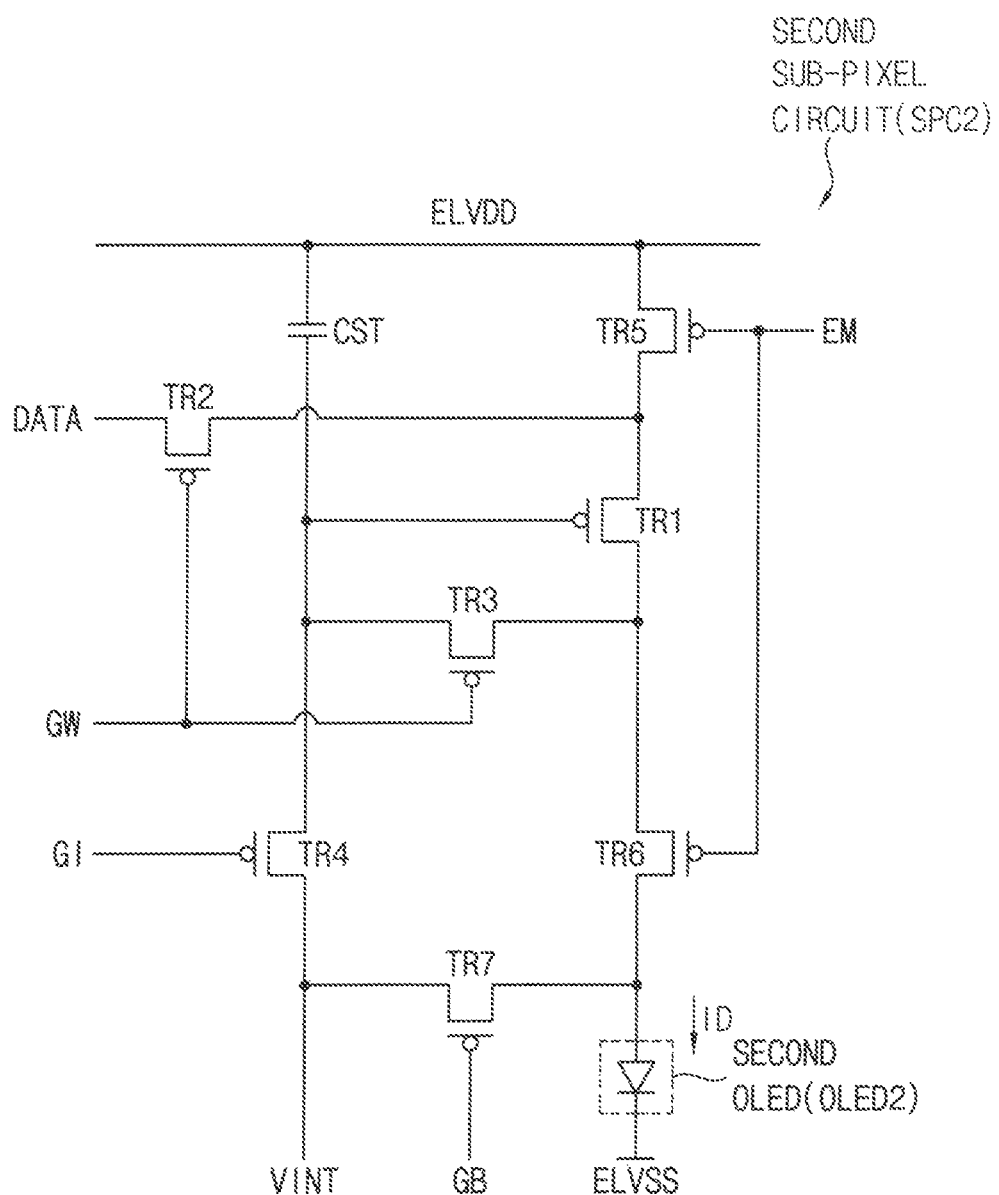
FIG. 8 is a circuit diagram showing a second sub-pixel circuit and a second organic light emitting diode disposed in the second display area of FIG. 6.

FIG. 6 is a partially enlarged plan view showing a part of the second display area of FIG. 3, FIG. 7 is a partially enlarged plan view showing an example of the second display area of FIG. 3, and FIG. 8 is a circuit diagram showing a second sub-pixel circuit and a second organic light emitting diode disposed in the second display area of FIG. 6. A second sub-pixel circuit SPC2 and a second organic light emitting diode OLED2 illustrated in FIG. 8 may have a configuration that is the same or substantially the same as (or similar to) the configuration of the first sub-pixel circuit SPC1 and the first organic light emitting diode OLED1 described with reference to FIG. 5. Accordingly, redundant descriptions of the components shown in FIG. 8 that are the same or substantially the same as (or similar to) the components described with reference to FIG. 5 may not be repeated.

Referring to FIGS. 3, 6, and 8, the display panel 200 may further include second sub-pixel circuits SPC2 and second organic light emitting diodes OLED2. In addition, the display panel 200 may include the second display area 20, and the second display area 20 may include a plurality of second sub-pixel areas 12 and a plurality of first transmission areas 21. For example, the second sub-pixel areas 12 may be arranged along the first direction D1 within the second display area 20, and the first transmission areas 21 may be arranged along the first direction D1 in a row different from a row in which the second sub-pixel areas 12 are arranged. In other words, the second sub-pixel areas 12 and the first transmission areas 21 may be arranged over the whole (e.g., over an entirety of the) second display area 20. In the present embodiment, when compared with the first sub-pixel areas 11 disposed at (e.g., in or on) the first display area 10 of FIG. 4, the second display area 20 may include a relatively smaller number of sub-pixel areas per unit area due to the first transmission areas 21. In other words, the second display area 20 may have a second resolution that is lower than a first resolution of the first display area 10.

Figure 12:
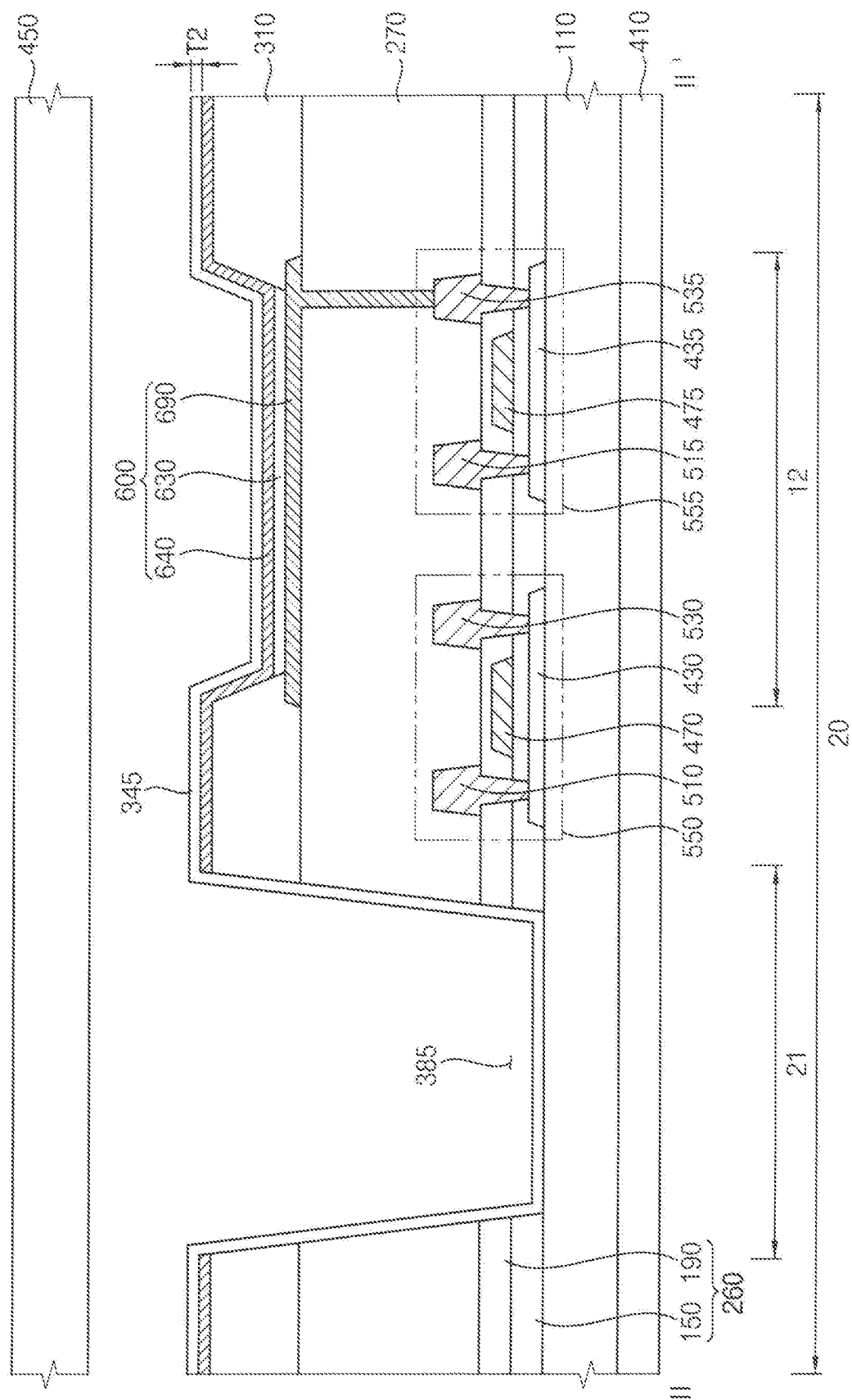
FIG. 12 is a cross-sectional view taken along the line II-II' of the organic light emitting display device of FIG. 6.

Each of the second sub-pixel circuits SPC2 may overlap with a corresponding second sub-pixel area 12, and the second organic light emitting diode OLED2 (e.g., corresponding to a second sub-pixel structure 600 of FIG. 12) may be disposed on the second sub-pixel circuit SPC2 (e.g., corresponding to a third semiconductor element 550 and a fourth semiconductor element 555 of FIG. 12). An image may be displayed at (e.g., in or on) the second sub-pixel area 12 through the second sub-pixel circuit SPC2 and the second organic light emitting diode OLED2.

In some embodiments, the second sub-pixel circuit SPC2 may overlap with a part of the second sub-pixel area 12, and a part of another second sub-pixel area 12 different from the second sub-pixel area 12 (e.g., a part of other second sub-pixel areas 12 adjacent to the second sub-pixel area 12). In addition, the second organic light emitting diodes OLED2 may be arranged by using an RGB stripe scheme in which rectangular-shaped pixels having the same or substantially the same size as each other are sequentially arranged, an S-stripe scheme including a blue organic light emitting diode having a relatively larger area, a WRGB scheme further including a white organic light emitting diode, an RGBG matrix scheme (e.g., a PENTILE® scheme, PENTILE® being a duly registered trademark of Samsung Display Co. Ltd.) in which RG-GB patterns are repeatedly arranged, or the like.

In addition, the first optical module 410 that is disposed on the second surface S2 of the display panel 200 may capture an image of an object located over the first surface S1 of the display panel 200 through the first transmission area 21. In other words, the first transmission area 21 may be transparent or substantially transparent.

In other embodiments, as shown in FIG. 7, the second display area 20 may include a first transmission area 31 having a relatively larger area. In other words, the second display area 20 may include a relatively smaller number of sub-pixel areas per unit area due to the first transmission area 31 having the relatively larger area. In this case, even when a resolution of the second display area 20 becomes relatively low, the first optical module 410 may relatively easily recognize the image of the object located over the first surface S1 of the display panel 200 due to the first transmission area 31 having the relatively larger area.

However, although each of the second display area 20, the second sub-pixel area 12, and the first transmission area 21 according to the present embodiment has been described as having a rectangular shape when viewed in a plan view, the shapes thereof are not limited thereto. For example, each of the second display area 20, the second sub-pixel area 12, and the first transmission area 21 may have a triangular shape, a rhombic shape, a polygonal shape a circular shape, a track shape, or an elliptical shape when viewed in a plan view.

As shown in FIG. 8, the second sub-pixel circuit SPC2 may include first to seventh transistors TR1, TR2, TR3, TR4, TR5, TR6, and TR7, a storage capacitor CST, a high power supply voltage (ELVDD) wire, a low power supply voltage (ELVSS) wire, an initialization voltage (VINT) wire, a data signal (DATA) wire, a gate signal (GW) wire, a gate initialization signal (GI) wire, an emission control signal (EM) wire, a diode initialization signal (GB) wire, and the like. In addition, the second sub-pixel circuit SPC2 and the second organic light emitting diode OLED2 may be electrically connected to each other. In this case, the first transistor TR1 of the second sub-pixel circuit SPC2 may correspond to the third semiconductor element 550 of FIG. 12, and the sixth transistor TR6 of the second sub-pixel circuit SPC2 may correspond to the fourth semiconductor element 555 of FIG. 12. In addition, the second organic light emitting diode OLED2 may correspond to the second sub-pixel structure 600 of FIG. 12, an anode terminal of the second organic light emitting diode OLED2 may correspond to a second lower electrode 690 of FIG. 12, and a cathode terminal of the second organic light emitting diode OLED2 may correspond to a second upper electrode 640 of FIG. 12.

In the present embodiment, the second sub-pixel circuit SPC2 may not be disposed at (e.g., in or on) the first transmission area 21. In other words, the second sub-pixel circuit SPC2 may expose the first transmission area 21.

In addition, the configuration of the first sub-pixel circuit SPC1 and the first organic light emitting diode OLED1 at (e.g., in or on) the first display area 10 may be the same or substantially the same as the configuration of the second sub-pixel circuit SPC2 and the second organic light emitting diode OLED2 at (e.g., in or on) the second display area 20. In other words, the number of the transistors included in the first sub-pixel circuit SPC1 at (e.g., in or on) the first sub-pixel area 11 may be equal to or substantially equal to the number of the transistors included in the second sub-pixel circuit SPC2 at (e.g., in or on) the second sub-pixel area 12.

Figure 10:
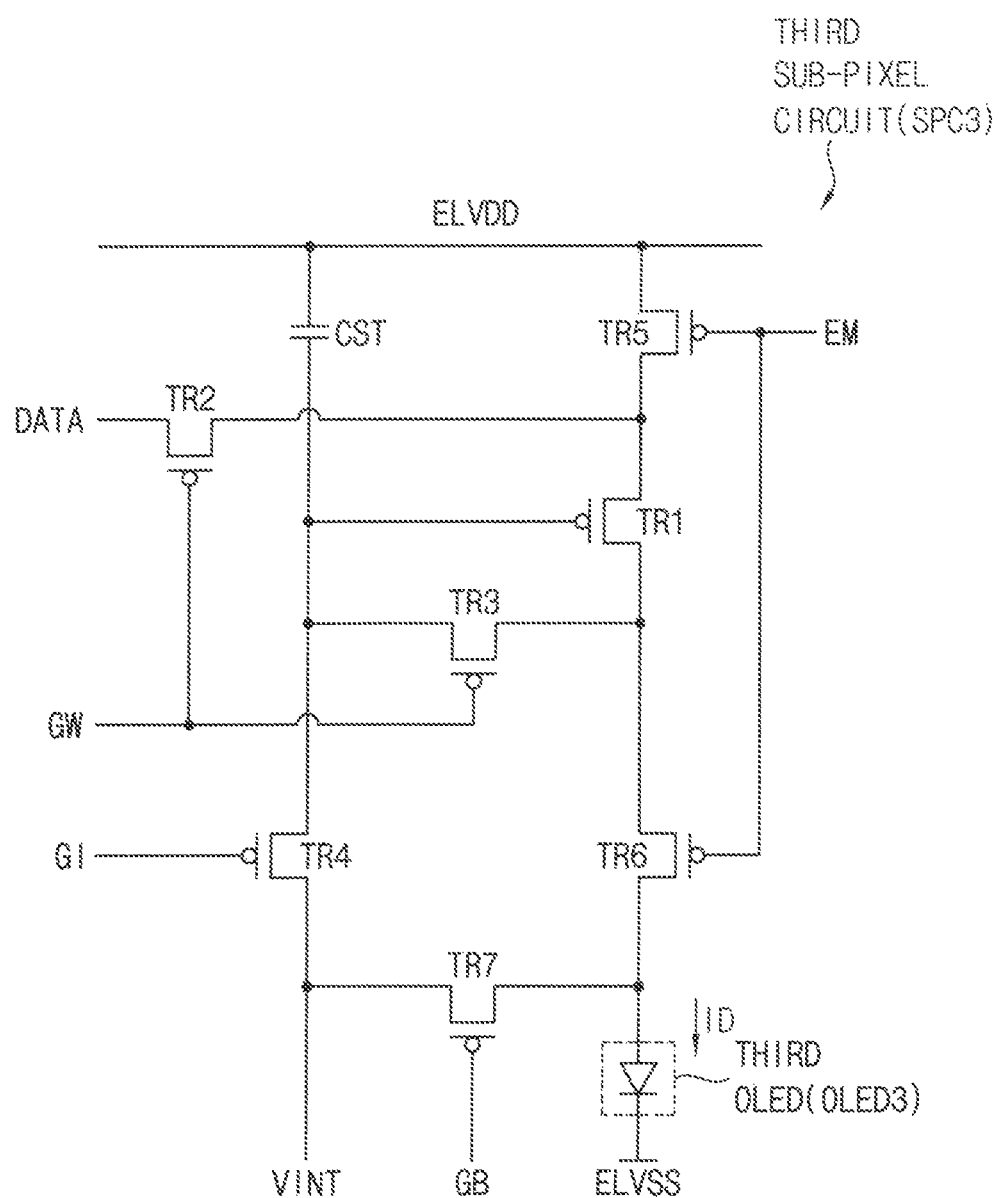
FIG. 10 is a circuit diagram shewing a third sub-pixel circuit and a third organic light emitting diode disposed in the third display area of FIG. 9.

FIG. 9 is a partially enlarged plan view showing a part of the third display area of FIG. 3, and FIG. 10 is a circuit diagram showing a third sub-pixel circuit and a third organic light emitting diode disposed in the third display area of FIG. 9. A third sub-pixel circuit SPC3 and a third organic light emitting diode OLED3 illustrated in FIG. 10 may have a configuration that is the same or substantially the same as (or similar to) the configuration of the first sub-pixel circuit SPC1 and the first organic light emitting diode OLED1 described above with reference to FIG. 5. Accordingly, redundant descriptions of the components shown in FIG. 10 that are the same or substantially the same as (or similar to) the components described with reference to FIG. 5 may not be repeated.

Referring to FIGS. 3, 9, and 10, the display panel 300 may further include third sub-pixel circuits SPC3 and third organic light emitting diodes OLED3. In addition, the display panel 300 may include the third display area 30, and the third display area 30 may include a plurality of third sub-pixel areas 13 and a plurality of second transmission areas 22. For example, the third sub-pixel areas 13 may be arranged along the first direction D1 within the third display area 30, and the second transmission areas 22 may be arranged along the first direction D1 in a row different from a row in which the third sub-pixel areas 13 are arranged. In other words, the third sub-pixel areas 13 and the second transmission areas 22 may be arranged over the whole (e.g., over an entirety of the) third display area 30. In the present embodiment, when compared with the first sub-pixel areas 11 disposed at (e.g., in or on) the first display area 10 of FIG. 4, the third display area 30 may include a relatively smaller number of sub-pixel areas per unit area due to the second transmission areas 22. In other words, the third display area 30 may have the second resolution that is lower than the first resolution of the first display area 10.

Figure 13:
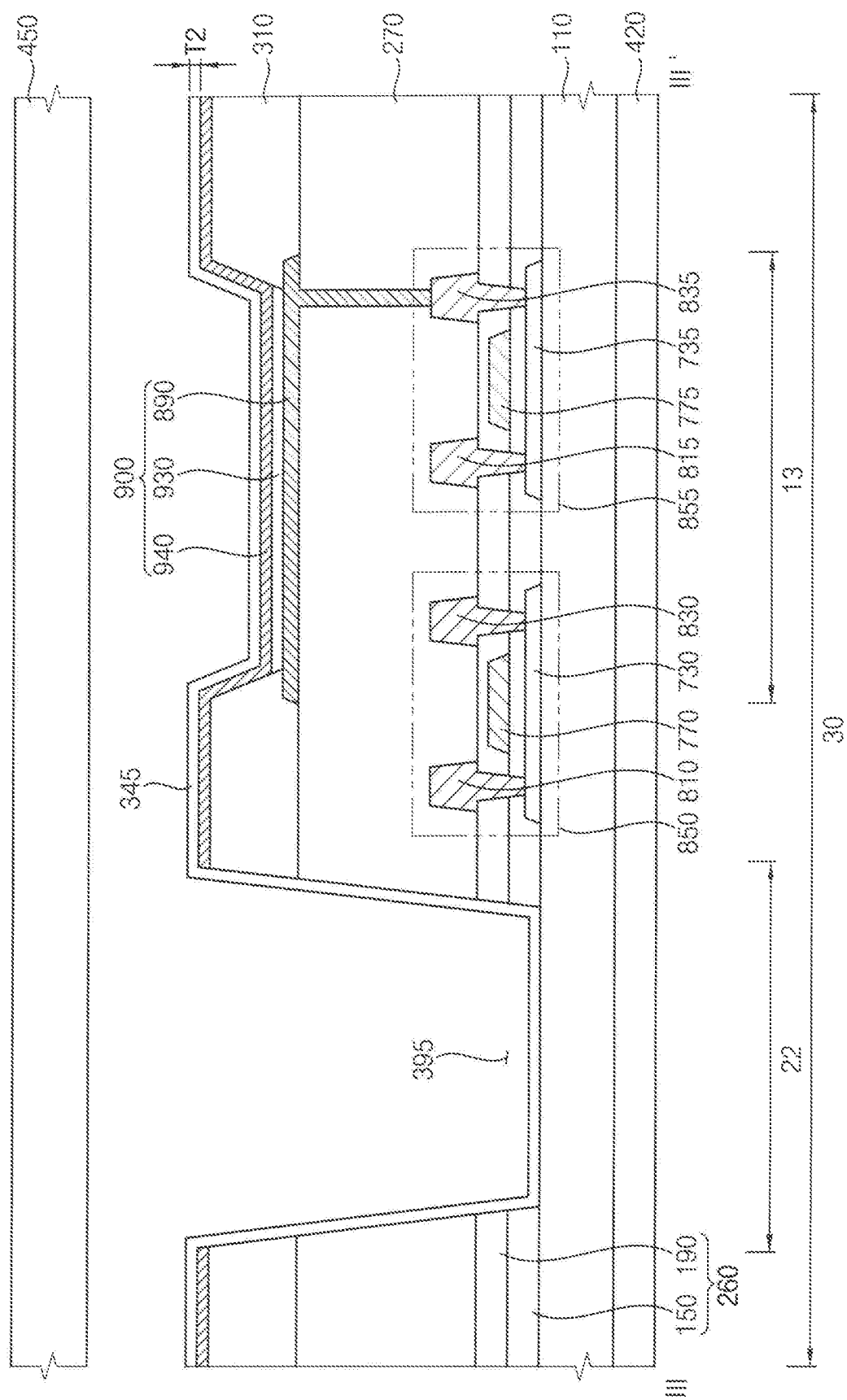
FIG. 13 is a cross-sectional view taken along the line III-III' of the organic light emitting display device of FIG. 9.

Each of the third sub-pixel circuits SPC3 may overlap with a corresponding third sub-pixel area 13, and the third organic light emitting diode OLED3 (e.g., corresponding to a third sub-pixel structure 900 of FIG. 13) may be disposed on the third sub-pixel circuit SPC3 (e.g., corresponding to a fifth semiconductor element 850 and a sixth semiconductor element 855 of FIG. 13). An image may be displayed at (e.g., in or on) the third sub-pixel area 13 through the third sub-pixel circuit SPC3 and the third organic light emitting diode OLED3.

In some embodiments, the third sub-pixel circuit SPC3 may overlap with a part of the third sub-pixel area 13, and a part of another third sub-pixel area 13 that is different from the third sub-pixel area 13 (e.g., a part of other third sub-pixel areas 13 adjacent to the third sub-pixel area 13). In addition, the third organic light emitting diodes OLED3 may be arranged by using an RGB stripe scheme in which rectangular-shaped pixels having the same or substantially the same size as each other are sequentially arranged, an S-stripe scheme including a blue organic light emitting diode having a relatively larger area, a WRGB scheme further including a white organic light emitting diode, an RGBG matrix scheme (e.g., a PENTILE® scheme, PENTILE® being a duly registered trademark of Samsung Display Co. Ltd.) in which RG-GB patterns are repeatedly arranged, or the like.

In addition, the second optical module 420 that is disposed at (e.g., in or on) the third display area 30 on the second surface S2 of the display panel 200 may detect a surrounding situation or may capture an image of an object located over the first surface S1 of the display panel 200 through the second transmission area 22. In other words, the second transmission area 22 may be transparent or substantially transparent.

However, although each of the third display area 30, the third sub-pixel area 13, and the second transmission area 22 according to the present embodiment has been described as having a rectangular shape when viewed in a plan view, the shapes thereof are not limited thereto. For example, each of the third display area 30, the third sub-pixel area 13, and the second transmission area 22 may have a triangular shape, a rhombic shape, a polygonal shape, a circular shape, a track shape, or an elliptical shape when viewed in a plan view.

As shown in FIG. 10, the third sub-pixel circuit SPC3 may include first to seventh transistors TR1, TR2, TR3, TR4, TR5, TR6, and TR7, a storage capacitor CST, a high power supply voltage (ELVDD) wire, a low power supply voltage (ELVSS) wire, an initialization voltage (VINT) wire, a data signal (DATA) wire, a gate signal (GW) wire, a gate initialization signal (GI) wire, an emission control signal (EM) wire, a diode initialization signal (GB) wire, and the like. In addition, the third sub-pixel circuit SPC3 and the third organic light emitting diode OLED3 may be electrically connected to each other. In this case, the first transistor TR1 of the third sub-pixel circuit SPC3 may correspond to the fifth semiconductor element 850 of FIG. 13, and the sixth transistor TR6 of the third sub-pixel circuit SPC3 may correspond to the sixth semiconductor element 855 of FIG. 13. In addition, the third organic light emitting diode OLED3 may correspond to the third sub-pixel structure 300 of FIG. 13, an anode terminal of the third organic light emitting diode OLED3 may correspond to a third lower electrode 890 of FIG. 13, and a cathode terminal of the third organic light emitting diode OLED3 may correspond to a third upper electrode 940 of FIG. 13.

In the present embodiment, the third sub-pixel circuit SPC3 may not be disposed at (e.g., in or on) the second transmission area 22. In other words, the third sub-pixel circuit SPC3 may expose the second transmission area 22.

In addition, the configuration of the first sub-pixel circuit SPC1 and the first organic light emitting diode OLED1 at (e.g., in or on) the first display area 10 may be the same or substantially the same as the configuration of the third sub-pixel circuit SPC3 and the third organic light emitting diode OLED3 at (e.g., in or on) the third display area 30. In other words, the number of the transistors included in the first sub-pixel circuit SPC1 at (e.g., in or on) the first sub-pixel area 11 may be equal to or substantially equal to the number of the transistors included in the third sub-pixel circuit SPC3 at (e.g., in or on) the third sub-pixel area 13.

FIG. 11 is a cross-sectional view taken along the line I-I' of the organic light emitting display device of FIG. 4, FIG. 12 is a cross-sectional view taken along the line II-II' of the organic light emitting display device of FIG. 6, and FIG. 13 is a cross-sectional view taken along the line III-III' of the organic light emitting display device of FIG. 9.

Referring to FIGS. 11, 12, and 13, the organic light emitting display device 100 may include a display panel 200, a first optical module (e.g., a first optical sensor or device) 410, a second optical module (e.g., a second optical sensor or device) 420, and the like. In this case, the display panel 200 may include a substrate 110, a first semiconductor element 250, a second semiconductor element 255, a third semiconductor element 550, a fourth semiconductor element 555, a fifth semiconductor element 850, a sixth semiconductor element 855, an insulating layer structure 260, a planarization layer 270, a pixel defining layer 310, a first sub-pixel structure 300, a second sub-pixel structure 600, a third sub-pixel structure 900, a capping layer 345, an encapsulation substrate 450, and the like.

In addition, the first semiconductor element 250 may include a first active layer 130, a first gate electrode 170, a first source electrode 210, and a first drain electrode 230, and the second semiconductor element 255 may include a second active layer 135, a second gate electrode 175, a second source electrode 215, and a second drain electrode 235. The third semiconductor element 550 may include a third active layer 430, a third gate electrode 470, a third source electrode 510, and a third drain electrode 530, and the fourth semiconductor element 555 may include a fourth active layer 435, a fourth gate electrode 475, a fourth source electrode 515, and a fourth drain electrode 535. The fifth semiconductor element 850 may include a fifth active layer 730, a fifth gate electrode 770, a fifth source electrode 810, and a fifth drain electrode 830, and the sixth semiconductor element 855 may include a sixth active layer 735, a sixth gate electrode 775, a sixth source electrode 815, and a sixth drain electrode 835. The insulating layer structure 260 may include a gate insulating layer 150 and an interlayer insulating layer 190.

The first sub-pixel structure 300 may include a first lower electrode 290, a first light emitting layer 330, and a first upper electrode 340. The second sub-pixel structure 600 may include a second lower electrode 690, a second light emitting layer 630, and a second upper electrode 640. The third sub-pixel structure 900 may include a third lower electrode 890, a third light emitting layer 930, and a third upper electrode 940. Because the display panel 200 includes the first display area 10 including the first sub-pixel area 11, the second display area 20 including the second sub-pixel area 12 and the first transmission area 21, and the third display area 30 including the third sub-pixel area 13 and the second transmission area 22, the substrate 110 may be divided into the first display area 10 including the first sub-pixel area 11, the second display area 20 including the second sub-pixel area 12 and the first transmission area 21, and the third display area 30 including the third sub-pixel area 13 and the second transmission area 22.

The substrate 110 may include a transparent or opaque material. The substrate 110 may include a quartz substrate, a synthetic quartz substrate, a calcium fluoride substrate, a fluorine-doped quartz (F-doped quartz) substrate, a soda-lime glass substrate, a non-alkali glass substrate, and/or the like.

In some embodiments, the substrate 110 may be a transparent resin substrate having flexibility. An example of the transparent resin substrate that may be used as the substrate 110 includes a polyimide substrate. In this case, the polyimide substrate may include a first polyimide layer, a barrier film layer, a second polyimide layer, and the like. For example, the polyimide substrate may have a configuration in which the first polyimide layer, the barrier film layer, and the second polyimide layer are sequentially stacked on a rigid glass substrate. In a method of manufacturing the organic light emitting display device 100, after arranging an insulating layer (e.g., a buffer layer) on the second polyimide layer of the polyimide substrate, an upper structure (e.g., the first to sixth semiconductor elements 250, 255, 550, 555, 850, and 855, the first to third sub-pixel structures 300, 600, and 900, and the like) may be formed on the insulating layer. After the formation of the upper structure, the rigid glass substrate may be removed. In other words, because the polyimide substrate is thin and flexible, it may be difficult to directly form the upper structure on the polyimide substrate. Accordingly, in this example, the upper structure may be formed by using the rigid glass substrate, and then the glass substrate may be removed, so that the polyimide substrate may be used as the substrate 110.

The buffer layer may be disposed on the substrate 110. The buffer layer may be disposed over the whole (e.g., over an entirety of the) substrate 110. The buffer layer may prevent or substantially prevent metal atoms and/or impurities from diffusing from the substrate 110 to the upper structure. In addition, when a surface of the substrate 110 is not uniform, the buffer layer may serve to improve a flatness of the surface of the substrate 110. Depending on a kind of the substrate 110, at least two buffer layers may be provided on the substrate 110, or the buffer layer may not be provided (e.g., the buffer layer may be omitted). For example, the buffer layer may include an organic material or an inorganic material.

The first active layer 130, the second active layer 135, the third active layer 430, the fourth active layer 435, the fifth active layer 730, and the sixth active layer 735 may be disposed on the substrate 110. For example, the first active layer 130 and the second active layer 135 may be spaced apart from each other at (e.g., in or on) the first display area 10 on the substrate 110, and the third active layer 430 and the fourth active layer 435 may be spaced apart from each other at (e.g., in or on) the second display area 20 except for the first transmission area 21 on the substrate 110. The fifth active layer 730 and the sixth active layer 735 may be spaced apart from each other at (e.g., in or on) the third display area 30 except for the second transmission area 22 on the substrate 110. Each of the first to sixth active layers 130, 135, 430, 435, 730, and 735 may include an oxide semiconductor an inorganic semiconductor (e.g., amorphous silicon or poly silicon), an organic semiconductor, and/or the like.

The gate insulating layer 150 may be disposed on the first to sixth active layers 130, 135, 430, 435, 730, and 735 and the substrate 110. In the present embodiment, the gate insulating layer 150 may not be disposed at (e.g., in or on) the first transmission area 21 and the second transmission area 22. In other words, the gate insulating layer 150 may have an opening that exposes a top surface of the substrate 110 located at (e.g., in or on) each of the first transmission area 21 and the second transmission area 22. For example, the gate insulating layer 150 may sufficiently cover the first to sixth active layers 130, 135, 430, 435, 730, and 735 on the substrate 110, and may have a flat or substantially flat top surface without creating a step around the first to sixth active layers 130, 135, 430, 435, 730, and 735. In some embodiments, the gate insulating layer 150 may be disposed along a profile of the first to sixth active layers 130, 135, 430, 435, 730, and 735 with a uniform or substantially uniform thickness to cover the first to sixth active layers 130, 135, 430, 435, 730, and 735 on the substrate 110. The gate insulating layer 150 may include a silicon compound, a metal oxide, and/or the like. For example, the gate insulating layer 150 may include silicon oxide (SiO$_x$), silicon nitride (SiN$_x$), silicon oxynitride (SiO$_x$N$_y$), silicon oxycarbide (SiO$_x$C$_y$), silicon carbonitride (SiC$_x$N$_y$), aluminum oxide (AlO$_x$), aluminum nitride (AlN$_x$), tantalum oxide (TaO$_x$), hafnium oxide (HfO$_x$), zirconium oxide (ZrO$_x$), titanium oxide (TiO$_x$), and/or the like.

The first gate electrode 170, the second gate electrode 175, the third gate electrode 470, the fourth gate electrode 475, the fifth gate electrode 770, and the sixth gate electrode 775 may be spaced apart from each other on the gate insulating layer 150. For example, the first gate electrode 170 may be disposed on a portion of the gate insulating layer 150 under which the first active layer 130 is located, the second gate electrode 175 may be disposed on a portion of the gate insulating layer 150 under which the second active layer 135 is located, the third gate electrode 470 may be disposed on a portion of the gate insulating layer 150 under which the third active layer 430 is located, the fourth gate electrode 475 may be disposed on a portion of the gate insulating layer 150 under which the fourth active layer 435 is located, the fifth gate electrode 770 may be disposed on a portion of the gate insulating layer 150 under which the fifth active layer 730 is located, and the sixth gate electrode 775 may be disposed on a portion of the gate insulating layer 150 under which the sixth active layer 735 is located.

Each of the first to sixth gate electrodes 170, 175, 470, 475, 770, and 775 may include a metal, an alloy, a metal nitride, a conductive metal oxide, a transparent conductive material, and/or the like. For example, each of the first to sixth gate electrodes 170, 175, 470, 475, 770, and 775 may include gold (Au), silver (Ag), aluminum (Al), tungsten (W), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), an aluminum-containing alloy, aluminum nitride (AlN$_x$), a silver-containing alloy, tungsten nitride (WN$_x$), a copper-containing alloy, a molybdenum-containing alloy, titanium nitride (TiN$_x$), tantalum nitride (TaN$_x$), strontium ruthenium oxide (SrRu$_x$O$_y$), zinc oxide (ZnO$_x$), indium tin oxide (ITO), tin oxide (SnO$_x$), indium oxide (InO$_x$), gallium oxide (GaO$_x$), indium zinc oxide (IZO), and/or the like. These materials may be used alone or in combination with each other. In some embodiments, each of the first to sixth gate electrodes 170, 175, 470, 475, 770, and 775 may include a multilayered structure including a plurality of layers.

The interlayer insulating layer 190 may be disposed on the first to sixth gate electrodes 170, 175, 470, 475, 770, and 775, and the gate insulating layer 150. In the present embodiment, the interlayer insulating layer 190 may not be disposed at (e.g., in or on) the first transmission area 21 and the second transmission area 22. In other words, the interlayer insulating layer 190 may have an opening that exposes the top surface of the substrate 110 located at (e.g., in or on) each of the first transmission area 21 and the second transmission area 22. The opening of the interlayer insulating layer 190 may overlap with the opening of the gate insulating layer 150.

For example, the interlayer insulating layer 190 may sufficiently cover the first to sixth gate electrodes 170, 175, 470, 475, 770, and 775 on the gate insulating layer 150, and may have a flat or substantially flat top surface without creating a step around the first to sixth gate electrodes 170, 175, 470, 475, 770, and 775. In some embodiments, the interlayer insulating layer 190 may be disposed along a profile of the first to sixth gate electrodes 170, 175, 470, 475, 770, and 775 with a uniform or substantially uniform thickness to cover the first to sixth gate electrodes 170, 175, 470, 475, 770, and 775 on the gate insulating layer 150. The interlayer insulating layer 190 may include a silicon compound, a metal oxide, and/or the like. Accordingly, the insulating layer structure 260 including the gate insulating layer 150 and the interlayer insulating layer 190 may be formed.

The first source electrode 210, the first drain electrode 230, the second source electrode 215, the second drain electrode 235, the third source electrode 510, the third drain electrode 530, the fourth source electrode 515, the fourth drain electrode 535, the fifth source electrode 810, the fifth drain electrode 830, the sixth source electrode 815, and the sixth drain electrode 835 may be disposed on the interlayer insulating layer 190. The first source electrode 210 may be connected to a source region of the first active layer 130 through a contact hole formed by removing first portions of the gate insulating layer 150 and the interlayer insulating layer 190, and the first drain electrode 230 may be connected to a drain region of the first active layer 130 through a contact hole formed by removing second portions of the gate insulating layer 150 and the interlayer insulating layer 190. In addition, the second source electrode 215 may be connected to a source region of the second active layer 135 through a contact hole formed by removing third portions of the gate insulating layer 150 and the interlayer insulating layer 190, and the second drain electrode 235 may be connected to a drain region of the second active layer 135 through a contact hole formed by removing fourth portions of the gate insulating layer 150 and the interlayer insulating layer 190.

The third source electrode 510 may be connected to a source region of the third active layer 430 through a contact hole formed by removing fifth portions of the gate insulating layer 150 and the interlayer insulating layer 190, and the third drain electrode 530 may be connected to a drain region of the third active layer 430 through a contact hole formed by removing sixth portions of the gate insulating layer 150 and the interlayer insulating layer 190. In addition, the fourth source electrode 515 may be connected to a source region of the fourth active layer 435 through a contact hole formed by removing seventh portions of the gate insulating layer 150 and the interlayer insulating layer 190, and the fourth drain electrode 535 may be connected to a drain region of the fourth active layer 435 through a contact hole formed by removing eighth portions of the gate insulating layer 150 and the interlayer insulating layer 190.

The fifth source electrode 810 may be connected to a source region of the fifth active layer 730 through a contact hole formed by removing ninth portions of the gate insulating layer 150 and the interlayer insulating layer 190, and the fifth drain electrode 830 may be connected to a drain region of the fifth active layer 730 through a contact hole formed by removing tenth portions of the gate insulating layer 150 and the interlayer insulating layer 190. In addition, the sixth source electrode 815 may be connected to a source region of the sixth active layer 735 through a contact hole formed by removing eleventh portions of the gate insulating layer 150 and the interlayer insulating layer 190, and the sixth drain electrode 835 may be connected to a drain region of the sixth active layer 735 through a contact hole formed by removing twelfth portions of the gate insulating layer 150 and the interlayer insulating layer 190.

Each of the first to sixth source electrodes 210, 215, 510, 515, 810, and 815 and the first to sixth drain electrodes 230, 235, 530, 535, 830, and 835 may include a metal, an alloy, a metal nitride, a conductive metal oxide, a transparent conductive material, and/or the like. These materials may be used alone or in combination with each other. In some embodiments, each of the first to sixth source electrodes 210, 215, 510, 515, 810, and 815 and the first to sixth drain electrodes 230, 235, 530, 535, 830, and 835 may have a multilayered structure including a plurality of layers.

Accordingly, the first semiconductor element 250 including the first active layer 130, the first gate electrode 170, the first source electrode 210, and the first drain electrode 230 may be formed, and the second semiconductor element 255 including the second active layer 135, the second gate electrode 175, the second source electrode 215, and the second drain electrode 235 may be formed. However, although only the first semiconductor element 250 (corresponding to the first transistor TR1 of FIG. 5) and the second semiconductor element 255 (corresponding to the sixth transistor TR6 of FIG. 5) are shown in FIG. 11, the second to fifth and seventh transistors TR2, TR3, TR4, TR5, and TR7, and the storage capacitor CST of FIG. 5 may be shown in another cross-sectional view of the first sub-pixel area 11 of FIG. 4.

In addition, the third semiconductor element 550 including the third active layer 430, the third gate electrode 470, the third source electrode 510, and the third drain electrode 530 may be formed, and the fourth semiconductor element 555 including the fourth active layer 435, the fourth gate electrode 475, the fourth source electrode 515, and the fourth drain electrode 535 may be formed. However, although only the third semiconductor element 550 (corresponding to the first transistor TR1 of FIG. 8) and the fourth semiconductor element 555 (corresponding to the sixth transistor TR6 of FIG. 8) are shown in FIG. 12, the second to fifth and seventh transistors TR2, TR3, TR4, TR5, and TR7, and the storage capacitor CST of FIG. 8 may be shown in another cross-sectional view of the second sub-pixel area 12 of FIG. 6.

The fifth semiconductor element 850 including the fifth active layer 730, the fifth gate electrode 770, the fifth source electrode 810, and the fifth drain electrode 830 may be formed, and the sixth semiconductor element 855 including the sixth active layer 735, the sixth gate electrode 775, the sixth source electrode 815, and the sixth drain electrode 835 may be formed. However, although only the fifth semiconductor element 850 (corresponding to the first transistor TR1 of FIG. 10) and the sixth semiconductor element 855 (corresponding to the sixth transistor TR6 of FIG. 10) are shown in FIG. 13, the second to fifth and seventh transistors TR2, TR3, TR4, TR5, and TR7, and the storage capacitor CST of FIG. 10 may be shown in another cross-sectional view of the third sub-pixel area 13 of FIG. 9.

In the present embodiment, although each of the first to sixth semiconductor elements 250, 255, 550, 555, 850, and 855 has been described as having a top gate structure, the configuration thereof according to one or more embodiments of the present disclosure is not limited thereto. For example, each of the first to sixth semiconductor elements 250, 255, 550, 555, 850, and 855 may have a bottom gate structure and/or a double gate structure.

The planarization layer 270 may be disposed on the interlayer insulating layer 190 and the first to sixth semiconductor elements 250, 255, 550, 555, 850, and 855. The planarization layer 270 may have contact holes that expose a part of the second drain electrode 235, a part of the fourth drain electrode 535, and a part of the sixth drain electrode 835, respectively. In the present embodiment, the planarization layer 270 may have an opening that exposes the top surface of the substrate 110 located at (e.g., in or on) each of the first transmission area 21 and the second transmission area 22, and the opening of the planarization layer 270 may overlap with the opening of the gate insulating layer 150 and the opening of the interlayer insulating layer 190.

The planarization layer 270 may have a relatively thick thickness to sufficiently cover the first to sixth semiconductor elements 250, 255, 550, 555, 850, and 855. In this case, the planarization layer 270 may have a flat or substantially flat top surface. In order to implement such a flat or substantially flat top surface of the planarization layer 270, a planarization process may be additionally performed on the planarization layer 270. The planarization layer 270 may include an organic material or an inorganic material. In the present embodiment, the planarization layer 270 may include an organic material. For example, the planarization layer 270 may include a photoresist, a polyacryl-based resin, a polyimide-based resin, a polyamide-based resin, a siloxane-based resin, an acryl-based resin, an epoxy-based resin, and/or the like.

The first lower electrode 290 the second lower electrode 690, and the third lower electrode 890 may be disposed on the planarization layer 270. For example, the first lower electrode 290 may be disposed at (e.g., in or on) the first sub-pixel area 11 on the planarization layer 270, and may contact (e.g., may make direct contact with) the second drain electrode 235 through the contact hole of the planarization layer 270, such that the first lower electrode 290 may be electrically connected to the second semiconductor element 255. In addition, the second lower electrode 690 may be disposed at (e.g., in or on) the second sub-pixel area 12 on the planarization layer 270, and may contact (e.g., may make direct contact with) the fourth drain electrode 535 through the contact hole of the planarization layer 270, such that the second lower electrode 690 may be electrically connected to the fourth semiconductor element 555. The third lower electrode 890 may be disposed at (e.g., in or on) the third sub-pixel area 13 on the planarization layer 270, and may contact (e.g., may make direct contact with) the sixth drain electrode 835 through the contact hole of the planarization layer 270, such that the third lower electrode 890 may be electrically connected to the sixth semiconductor element 855.

Each of the first, second, and third lower electrodes 290, 690, and 390 may include a metal, an alloy, a metal nitride, a conductive metal oxide, a transparent conductive material, and/or the like. These materials may be used alone or in combination with each other. In some embodiments, each of the first, second, and third lower electrodes 290, 690, and 890 may have a multilayered structure including a plurality of layers.

The pixel defining layer 310 may be disposed on a part of each of the first, second, and third lower electrodes 290, 690, and 890, and the planarization layer 270. The pixel defining layer 310 may cover side portions (e.g., opposite side portions) of each of the first, second, and third lower electrodes 290, 690, and 890, and may have an opening that exposes a part of a top surface of each of the first, second, and third lower electrodes 290, 690, and 890.

In the present embodiment, the pixel defining layer 310 may have an opening that exposes the top surface of the substrate 110 located at (e.g., in or on) each of the first transmission area 21 and the second transmission area 22, and the opening of the pixel defining layer 310 may overlap with the opening of the planarization layer 270, the opening of the interlayer insulating layer 190, and the opening of the gate insulating layer 150. In this case, the openings (e.g., a first opening) located at (e.g., in or on) the first transmission area 21 may be defined as a first transmission window 385, and the openings (e.g., a second opening) located at (e.g., in or on) the second transmission area 22 may be defined as a second transmission window 395. Because the insulating layer structure 260 is not disposed at (e.g., in or on) the first transmission area 21 and the second transmission area 22, a transmittance of each of the first transmission window 385 and the second transmission window 395 may be improved (e.g., may be relatively increased). The pixel defining layer 310 may be formed of an organic material or an inorganic material. In the present embodiment, the pixel defining layer 310 may include an organic material.

The first light emitting layer 330 may be disposed on the first lower electrode 290 exposed by the pixel defining layer 310, the second light emitting layer 630 may be disposed on the second lower electrode 690 exposed by the pixel defining layer 310, and the third light emitting layer 930 may be disposed on the third lower electrode 890 exposed by the pixel defining layer 310. Each of the first, second, and third light emitting layers 330, 630, and 930 may be formed by using at least one of various suitable light emitting materials for emitting different colored lights (e.g., a red light, a green light, a blue light, and/or the like) according to the sub-pixels. As another example, each of the first, second, and third light emitting layers 330, 630, and 930 may be formed by stacking a plurality of light emitting materials for generating different colored lights, for example, such as a red light, a green light, and a blue light, to emit a white light as a whole. In this case, a color filter may be disposed on each of the first, second, and third light emitting layers 330, 630, and 930 (e.g., to overlap with each of the first, second, and third light emitting layers 330, 630, and 930 on a top surface of the encapsulation substrate 450). The color filter may include at least one of a red color filter, a green color filter, and/or a blue color filter. In some embodiments, the color filter may include a yellow color filter, a cyan color filter, and/or a magenta color filter. The color filter may include a photosensitive resin or a color photoresist.

The first upper electrode 340, the second upper electrode 640, and the third upper electrode 940 may be disposed on the pixel defining layer 310, and on the first, second, and third light emitting layers 330, 630, and 930. In the present embodiment, the second and third upper electrodes 640 and 940 may expose the top surface of the substrate 110 located at (e.g., in or on) the first transmission area 21 and the second transmission area 22, respectively. However, although the first, second, and third upper electrodes 340, 640, and 940 are shown in FIGS. 11, 12, and 13 as being separated (e.g., spaced apart) from each other, the first, second, and third upper electrodes 340, 640, and 940 may be electrically connected to each other, and may be formed as a single layer or substantially as a single layer. For example, the first, second, and third upper electrodes 340, 640, and 940 may be integrally formed at (e.g., in or on) the first display area 10, the second display area 20, and the third display area 30, except for the first transmission area 21 and the second transmission area 22. In some embodiments, the first, second, and third upper electrodes 340, 640, and 940 may be formed over the whole (e.g., over an entirety of) the first display area 10, the second display area 20, and the third display area 30.

Each of the first, second, and third upper electrodes 340, 640, and 940 may include a metal, an alloy, a metal nitride, a conductive metal oxide, a transparent conductive material, and/or the like. These materials may be used alone or in combination with each other. In some embodiments, each of the first, second, and third upper electrodes 340, 640, and 940 may have a multilayered structure including a plurality of layers. Accordingly, the first sub-pixel structure 300 including the first lower electrode 290, the first light emitting layer 330, and the first upper electrode 340, the second sub-pixel structure 600 including the second lower electrode 690, the second light emitting layer 630, and the second upper electrode 640, and the third sub-pixel structure 900 including the third lower electrode 890, the third light emitting layer 930, and the third upper electrode 940 may be formed.

The capping layer 345 may be disposed on the first, second, and third upper electrodes 340, 640, and 940. In the present embodiment, the capping layer 345 may be disposed over the whole (e.g., over an entirety of the) substrate 110. In addition, the capping layer 345 may have a first thickness T1 at (e.g., in or on) the first display area 10, and may have a second thickness T2 that is less than the first thickness T1 at (e.g., in or on) the second display area 20 and the third display area 30. For example, the capping layer 345 may have a relatively thinner thickness (e.g., the second thickness T2) at (e.g., in or on) the first transmission area 21 and the second transmission area 22, so that the transmittance of each of the first transmission window 385 and the second transmission window 395 may be improved (e.g., may be relatively less reduced). In some embodiments, the capping layer 345 may not be disposed at (e.g., in or on) the first transmission area 21 and the second transmission area 22.

The capping layer 345 may protect the first, second, and third sub-pixel structures 300, 600, and 900, and may include an organic material or an inorganic material. For example, the capping layer 345 may include triamine derivatives, arylenediamine derivatives, 4,4'-bis(N-carbazolyl)-1, 1'-biphenyl (CBP), tris-8-hydroxyquinoline aluminum (Alq$_3$), and/or the like.

The encapsulation substrate 450 may be disposed on the capping layer 345. The encapsulation substrate 450 may include the same or substantially the same material as the substrate 110. For example, the encapsulation substrate 450 may include a quartz substrate, a synthetic quartz substrate, a calcium fluoride substrate, a fluorine-doped quartz substrate, a soda-lime glass substrate, a non-alkali glass substrate, and/or the like. In other embodiments, the encapsulation substrate 450 may include a transparent inorganic material or a flexible plastic. For example, the encapsulation substrate 450 may include a transparent resin substrate having flexibility. In this case, in order to improve flexibility of the organic light emitting display device 100, the encapsulation substrate 450 may have a structure in which at least one inorganic layer and at least one organic layer are alternately stacked, and the capping layer 345 may not be provided (e.g., may be omitted). The stacked structure may include a first inorganic layer, an organic layer, and a second inorganic layer. For example, the first inorganic layer having flexibility may be disposed along a profile of the upper electrode 340, the organic layer having flexibility may be disposed on the first inorganic layer, and the second inorganic layer having flexibility may be disposed on the organic layer. In other words, the stacked structure may correspond to a thin film encapsulation structure that contacts (e.g., that makes direct contact with) the upper electrode 340. Accordingly, the display panel 200 including the substrate 110, the first semiconductor element 250, the second semiconductor element 255, the third semiconductor element 550, the fourth semiconductor element 555, the fifth semiconductor element 850, the sixth semiconductor element 855, the insulating layer structure 260, the planarization layer 270, the pixel defining layer 310, the first sub-pixel structure 300, the second sub-pixel structure 600, the third sub-pixel structure 900, the capping layer 345, and the encapsulation substrate 450 may be formed.

The first optical module 410 may be disposed on a bottom surface of the substrate 110 (e.g., the second surface S2 of the display panel 200) to overlap with the second display area 20. The first optical module 410 may capture an image of an object located over the first surface S1 of the display panel 200 through the first transmission area 21. In the present embodiment, the first optical module 410 may include a camera module (e.g., a camera, a camera sensor, or a camera device).

The second optical module 420 may be disposed on the bottom surface of the substrate 110 to overlap with the third display area 30. The second optical module 420 may detect a surrounding situation or an image of an object located over the first surface S1 of the display panel 200 through the second transmission area 22. In the present embodiment, the second optical module 420 may include a face recognition sensor module (e.g., a face recognition sensor or device), a pupil recognition sensor module (e.g., a pupil recognition sensor or device), an acceleration sensor module (e.g., an acceleration sensor or device), a geomagnetic sensor module (e.g., a geomagnetic sensor or device), a proximity sensor module (e.g., a proximity sensor or device), an infrared sensor module (e.g., an infrared sensor or device), an illuminance sensor module (e.g., an illuminance sensor or device), and/or the like. Accordingly, the organic light emitting display device 100 including the display panel 200, the first optical module 410, and the second optical module 420 may be formed.

Because the organic light emitting display device 100 according to one or more embodiments of the present disclosure includes the first display area 10 having the first resolution, and the second and third display areas 20 and 30 having the second resolution that is lower than the first resolution, an image may also be displayed at (e.g., in or on) a portion where the first optical module 410 and the second optical module 420 are disposed. In addition, because the organic light emitting display device 100 includes the first transmission window 385 and the second transmission window 395, the first optical module 410 and the second optical module 420 may detect a surrounding situation or may capture an image of an object located over the first surface S1 of the display panel 200 through the first transmission window 385 and the second transmission window 395.

Figure 14:
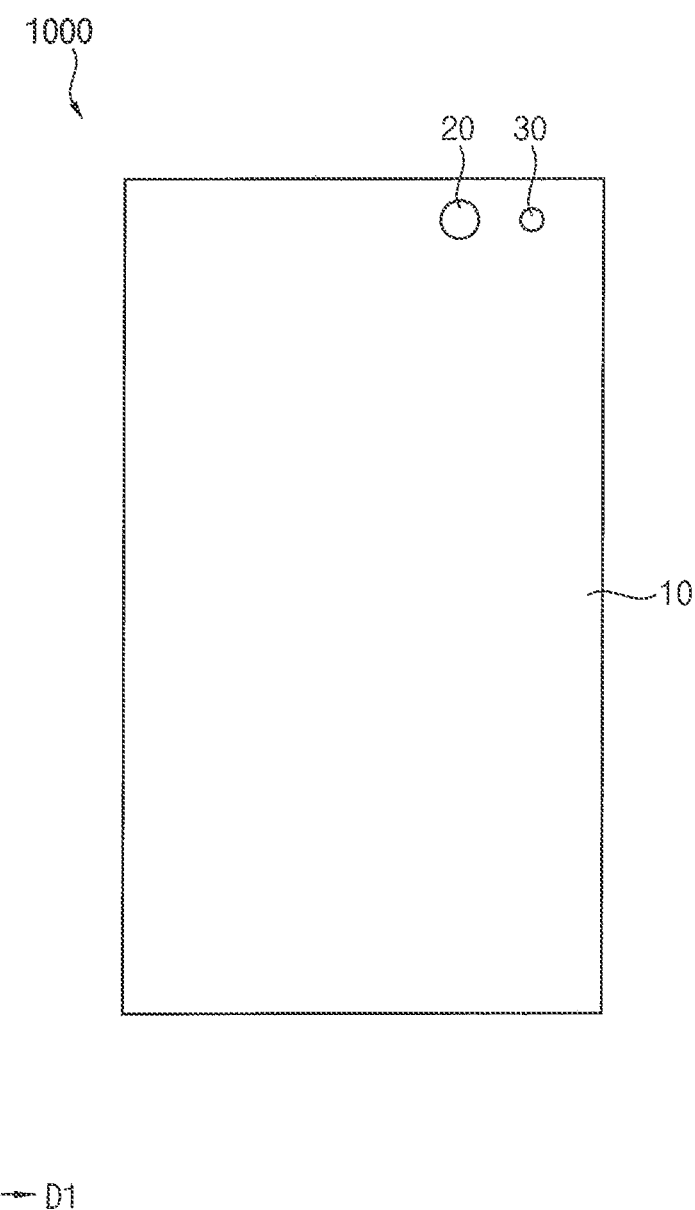
FIG. 14 is a plan view showing an organic light emitting display device according to one or more embodiments of the present disclosure.
Figure 15:
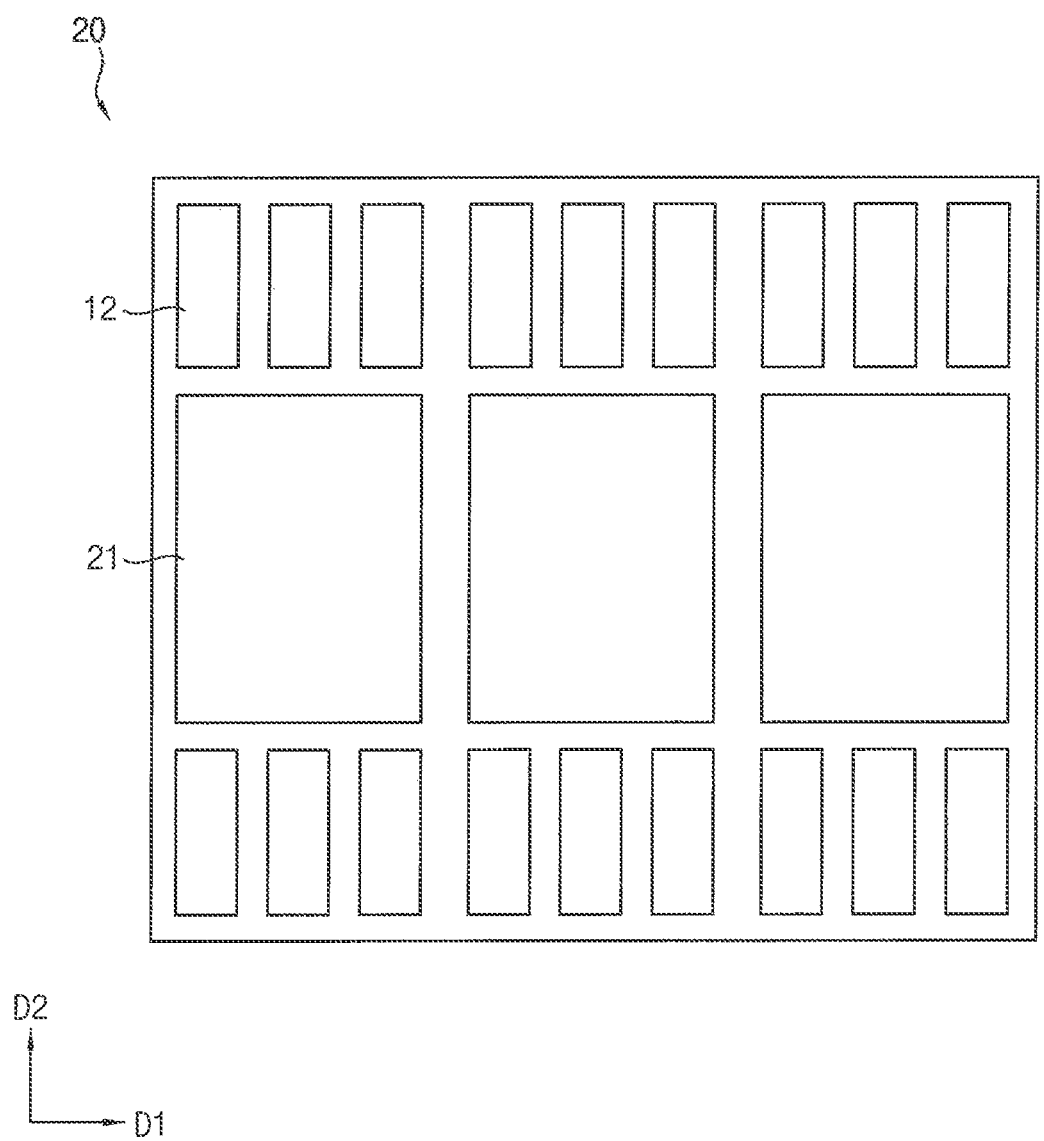
FIG. 15 is a partially enlarged plan view showing a part of a second display area of FIG. 14.
Figure 16:
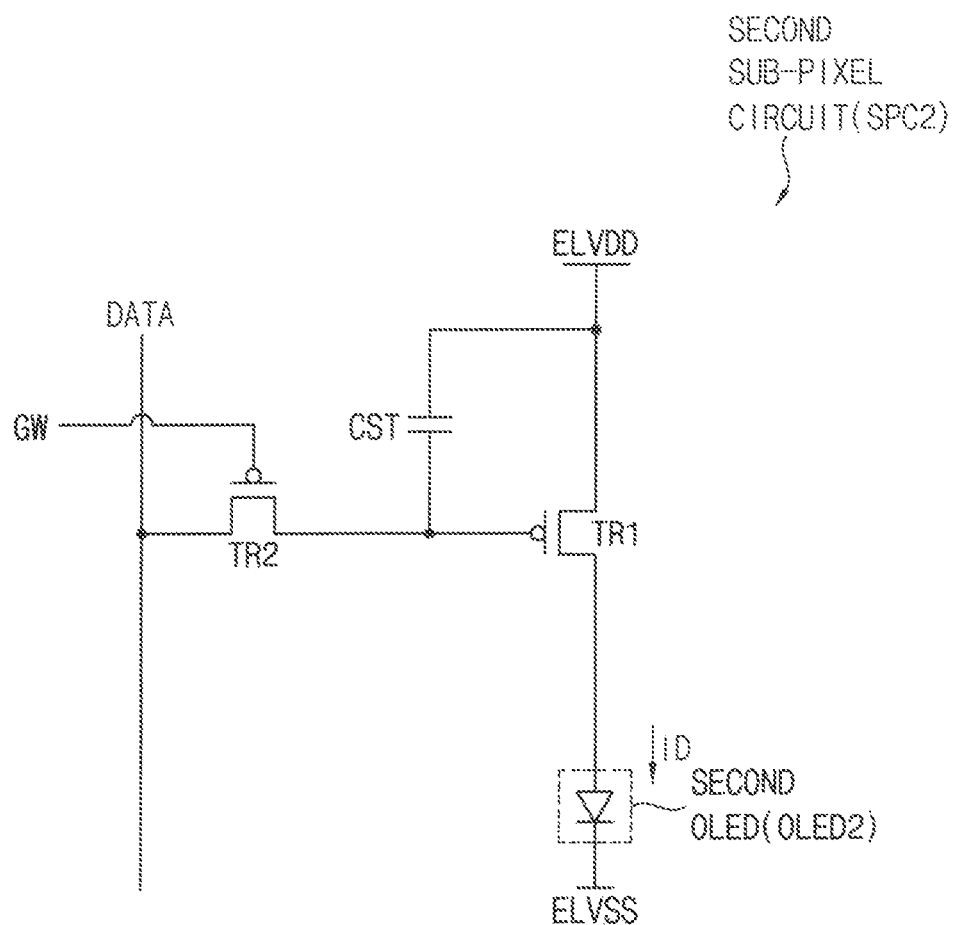
FIG. 16 is a circuit diagram shewing a second sub-pixel circuit and a second organic light emitting diode disposed in the second display area of FIG. 15.
Figure 17:
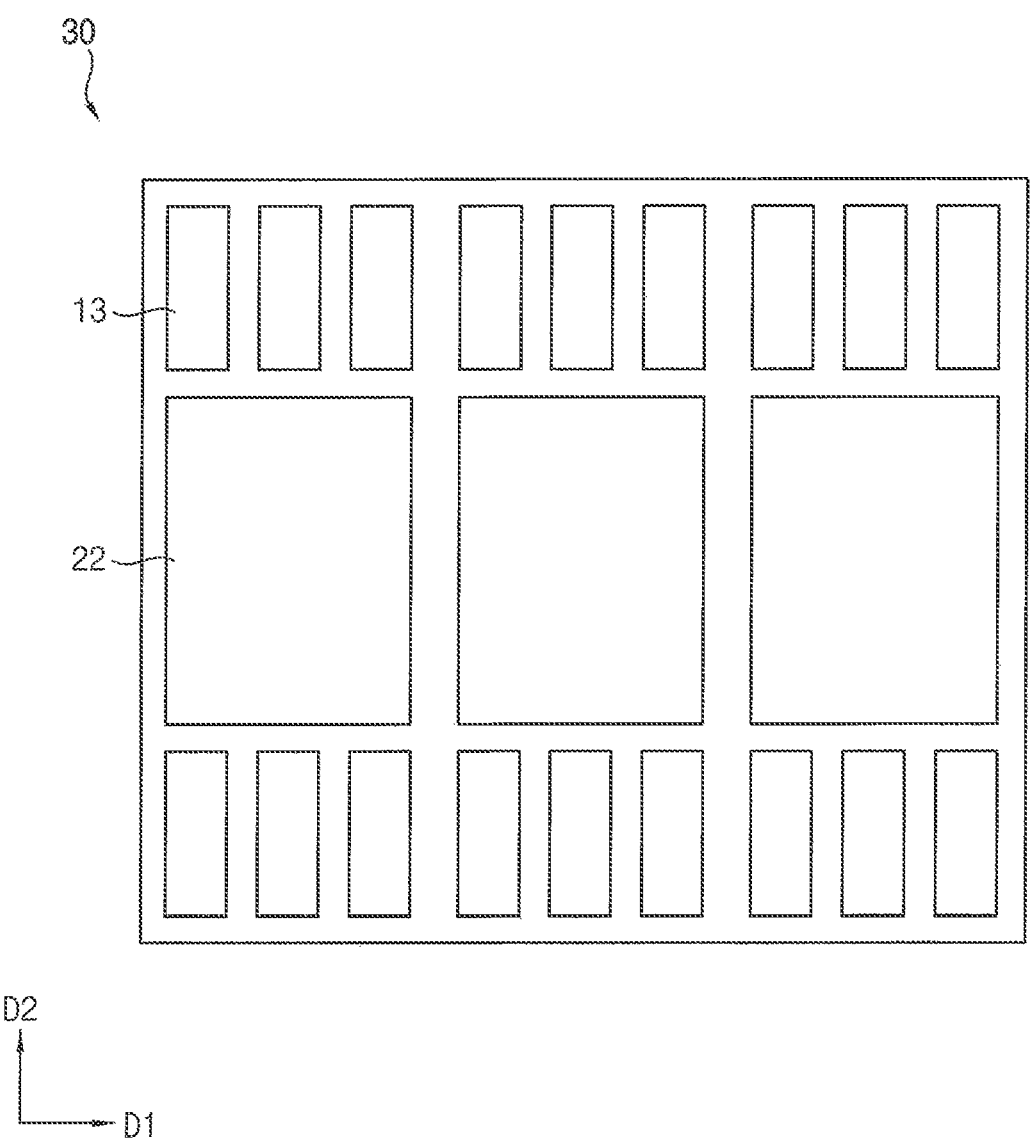
FIG. 17 is a partially enlarged plan view showing a part of a third display area of FIG. 14.
Figure 18:
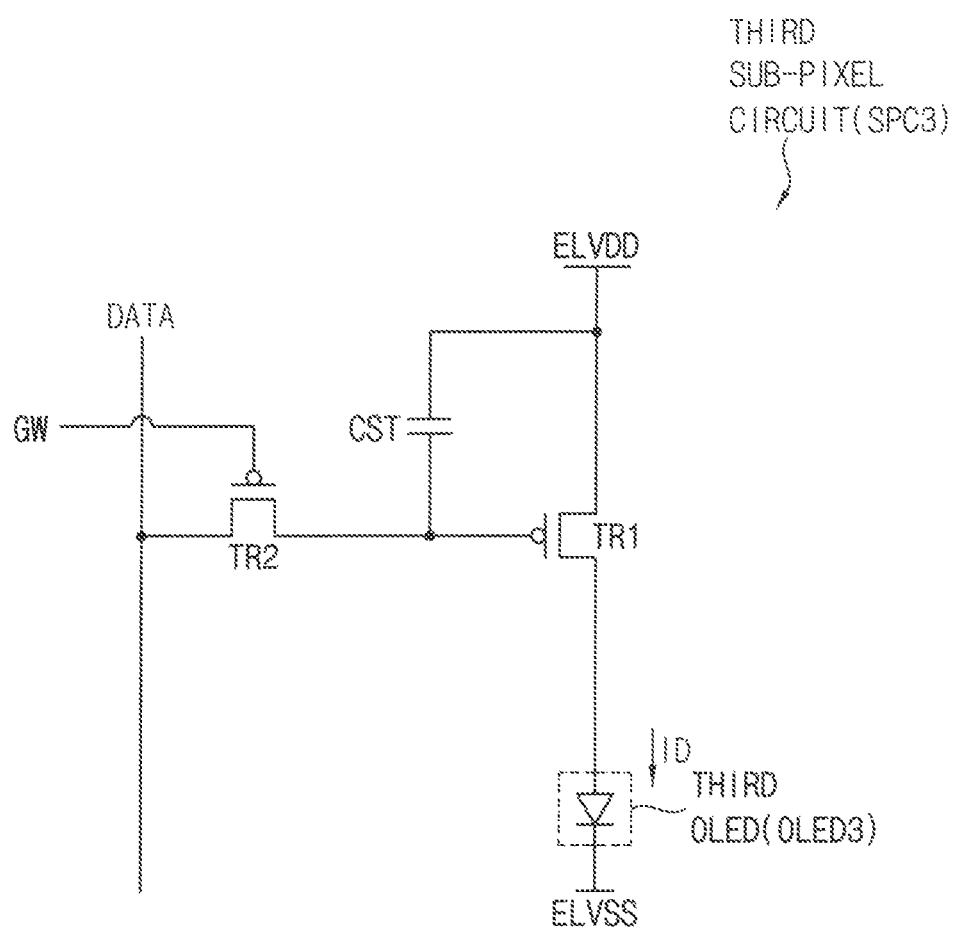
FIG. 18 is a circuit diagram showing a third sub-pixel circuit and a third organic light emitting diode disposed in the third display area of FIG. 15.

FIG. 14 is a plan view showing an organic light emitting display device according to one or more embodiments of the present disclosure, FIG. 15 is a partially enlarged plan view showing a part of a second display area of FIG. 14, FIG. 16 is a circuit diagram showing a second sub-pixel circuit and a second organic light emitting diode disposed in the second display area of FIG. 15, FIG. 17 is a partially enlarged plan view showing a part of a third display area of FIG. 14, and FIG. 18 is a circuit diagram showing a third sub-pixel circuit and a third organic light emitting diode disposed in the third display area of FIG. 15. An organic light emitting display device 1000 illustrated in FIGS. 14 to 18 may have a configuration that is the same or substantially the same as (or similar to) the configuration of the organic light emitting display device 100 described above with reference to FIGS. 1 to 13. Accordingly, redundant descriptions of the components shown in FIGS. 14 to 18 that are the same or substantially the same as (or similar to) the components described above with reference to FIGS. 1 to 13 may not be repeated.

Referring to FIGS. 1, 2, and 14, the organic light emitting display device 1000 may include a display panel 200, a first optical module (e.g., a first optical sensor or device) 410, a second optical module (e.g., a second optical sensor or device) 420, and the like. The display panel 200 may have a first surface S1 for displaying an image, and a second surface S2 opposite to the first surface S1. The first optical module 410 and the second optical module 420 may be disposed on one side (e.g., on one end) of the second surface S2 of the display panel 200, and the first optical module 410 and the second optical module 420 may be adjacent to each other.

The first display area 10 may include a plurality of first sub-pixel areas (e.g., corresponding to the first sub-pixel area 11 of FIG. 4), the second display area 20 may include a plurality of second sub-pixel areas and a plurality of first transmission areas (e.g., corresponding to a second sub-pixel area 12 and a first transmission area 21 of FIG. 15), and the third display area 30 may include a plurality of third sub-pixel areas and a plurality of second transmission areas (e.g., corresponding to a third sub-pixel area 13 and a second transmission area 22 of FIG. 17). In the present embodiment, the display panel 200 may display the image with different resolutions at (e.g., in or on) the first display area 10 and the second and third display areas 20 and 30. For example, the image may be displayed with a first resolution at (e.g., in or on) the first display area 10, and the image may be displayed with a second resolution that is lower than the first resolution at (e.g., in or on) the second and third display areas 20 and 30. In other words, the first display area 10 may have the first resolution, and each of the second and third display areas 20 and 30 may have the second resolution.

Referring to FIGS. 4 and 5, the display panel 200 may further include first sub-pixel circuits SPC1 and first organic light emitting diodes OLED1. In addition, the display panel 200 may have a first display area 10, and the first display area 10 may include a plurality of first sub-pixel areas 11.

Each of the first sub-pixel circuits SPC1 may overlap with a corresponding first sub-pixel area 11, and the first organic light emitting diode OLED1 may be disposed on the first sub-pixel circuit SPC1. An image may be displayed at (e.g., in or on) the first sub-pixel area 11 through the first sub-pixel circuit SPC1 and the first organic light emitting diode OLED1.

As shown in FIG. 5, the first sub-pixel circuit SPC1 may include the first to seventh transistors TR1, TR2, TR3, TR4, TR5, TR6, and TR7, the storage capacitor CST, the high power supply voltage (ELVDD) wire, the low power supply voltage (ELVSS) wire, the initialization voltage (VINT) wire, the data signal (DATA) wire, the gate signal (GW) wire, the gate initialization signal (GI) wire, the emission control signal (EM) wire, the diode initialization signal (GB) wire, and the like. In addition, the first sub-pixel circuit SPC1 and the first organic light emitting diode OLED1 may be electrically connected to each other.

Referring to FIGS. 15 and 16, the display panel 200 may further include second sub-pixel circuits SPC2 and second organic light emitting diodes OLED2. In addition, the display panel 200 may include the second display area 20, and the second display area 20 may include a plurality of second sub-pixel areas 12 and a plurality of first transmission areas 21. In the present embodiment, when compared with the first sub-pixel areas 11 disposed at (e.g., in or on) the first display area 10 of FIG. 4, the second display area 20 may include a relatively smaller number of sub-pixel areas per unit area due to the first transmission areas 21. In other words, the second resolution of the second display area 20 may be lower than the first resolution of the first display area 10.

Each of the second sub-pixel circuits SPC2 may overlap with a corresponding second sub-pixel area 12, and the second organic light emitting diode OLED2 may be disposed on the second sub-pixel circuit SPC2. An image may be displayed at (e.g., in or on) the second sub-pixel area 12 through the second sub-pixel circuit SPC2 and the second organic light emitting diode OLED2. In addition, the first optical module 410 disposed on the second surface S2 of the display panel 200 may capture an image of an object located over the first surface S1 of the display panel 200 through the first transmission area 21. In other words, the first transmission area 21 may be transparent or substantially transparent.

As shown in FIG. 16, the second sub-pixel circuit SPC2 may include first and second transistors TR1 and TR2, a storage capacitor CST, a high power supply voltage (ELVDD) wire, a low power supply voltage (ELVSS) wire, a data signal (DATA) wire, a gate signal (GW) wire, and the like. In addition, the second sub-pixel circuit SPC2 and the second organic light emitting diode OLED2 may be electrically connected to each other.

In the present embodiment, the second sub-pixel circuit SPC2 may not be disposed at (e.g., in or on) the first transmission area 21. In other words, the second sub-pixel circuit SPC2 may expose the first transmission area 21.

In addition, the configuration of the first sub-pixel circuit SPC1 and the first organic light emitting diode OLED1 at (e.g., in or on) the first display area 10 may be different from the configuration of the second sub-pixel circuit SPC2 and the second organic light emitting diode OLED2 at (e.g., in or on) the second display area 20. In other words, the number of the transistors included in the first sub-pixel circuit SPC1 at (e.g., in or on) the first sub-pixel area 11 may be greater than the number of the transistors included in the second sub-pixel circuit SPC2 at (e.g., in or on) the second sub-pixel area 12.

When compared with the first transmission area 21 of FIG. 6, the first transmission area 21 of FIG. 15 may have a relatively larger area, because the second sub-pixel circuit SPC2 of FIG. 16 does not include the third, fourth, fifth, sixth, and seventh transistors TR3, TR4, TR5, TR6, and TR7, the initialization voltage (VINT) wire, the gate initialization signal (GI) wire, the emission control signal (EM) wire, the diode initialization signal (GB) wire, and the like. In this case, the first optical module 410 may relatively easily capture an image of an object located over the first surface S1 of the display panel 200 due to the first transmission area 21 having the relatively larger area.

Referring to FIGS. 17 and 18, the display panel 300 may further include third sub-pixel circuits SPC3 and third organic light emitting diodes OLED3. In addition, the display panel 300 may include the third display area 30, and the third display area 30 may include a plurality of third sub-pixel areas 13 and a plurality of second transmission areas 22. In the present embodiment, when compared with the first sub-pixel areas 11 disposed at (e.g., in or on) the first display area 10 of FIG. 4, the third display area 30 may include a relatively smaller number of sub-pixel areas per unit area due to the second transmission areas 22. In other words, the second resolution of the third display area 30 may be lower than the first resolution of the first display area 10.

Each of the third sub-pixel circuits SPC3 may overlap with a corresponding third sub-pixel area 13, and the third organic light emitting diode OLED3 may be disposed on the third sub-pixel circuit SPC3. An image may be displayed at (e.g., in or on) the third sub-pixel area 13 through the third sub-pixel circuit SPC3 and the third organic light emitting diode OLED3. In addition, the second optical module 420 disposed on the second surface S2 of the display panel 200 may detect a surrounding situation or capture an image of an object located over the first surface S1 of the display panel 200 through the second transmission area 22. In other words, the second transmission area 22 may be transparent or substantially transparent.

As shown in FIG. 18, the third sub-pixel circuit SPC3 may include first and second transistors TR1 and TR2, a storage capacitor CST, a high power supply voltage (ELVDD) wire, a low power supply voltage (ELVSS) wire, a data signal (DATA) wire, a gate signal (GW) wire, and the like. In addition, the third sub-pixel circuit SPC3 and the third organic light emitting diode OLED3 may be electrically connected to each other.

In the present embodiment, the third sub-pixel circuit SPC3 may not be disposed at (e.g., in or on) the second transmission area 22. In other words, the third sub-pixel circuit SPC3 may expose the second transmission area 22.

In addition, the configuration of the first sub-pixel circuit SPC1 and the first organic light emitting diode OLED1 at (e.g., in or on) the first display area 10 may be different from the configuration of the third sub-pixel circuit SPC3 and the third organic light emitting diode OLED3 at (e.g., in or on) the third display area 30. In other words, the number of the transistors included in the first sub-pixel circuit SPC1 at (e.g., in or on) the first sub-pixel area 11 may be greater than the number of the transistors included in the third sub-pixel circuit SPC3 at (e.g., in or on) the third sub-pixel area 13. For example, the configuration of the second sub-pixel circuit SPC2 and the second organic light emitting diode OLED2 may be the same or substantially the same as the configuration of the third sub-pixel circuit SPC3 and the third organic light emitting diode OLED3, and the number of the transistors included in the second sub-pixel circuit SPC2 at (e.g., in or on) the second sub-pixel area 12 may be equal to or substantially equal to the number of the transistors included in the third sub-pixel circuit SPC3 at (e.g., in or on) the third sub-pixel area 13.

When compared with the second transmission area 22 of FIG. 9, the second transmission area 22 of FIG. 17 may have a relatively larger area because the third sub-pixel circuit SPC3 of FIG. 18 does not include the third, fourth, fifth, sixth, and seventh transistors TR3, TR4, TR5, TR6, and TR7, the initialization voltage (VINT) wire, the gate initialization signal (GI) wire, the emission control signal (EM) wire, the diode initialization signal (GB) wire, and the like. In this case, the second optical module 420 may easily detect a surrounding situation or easily capture an image of an object located over the first surface S1 of the display panel 200 due to the second transmission area 22 having the relatively larger area.

Figure 19:
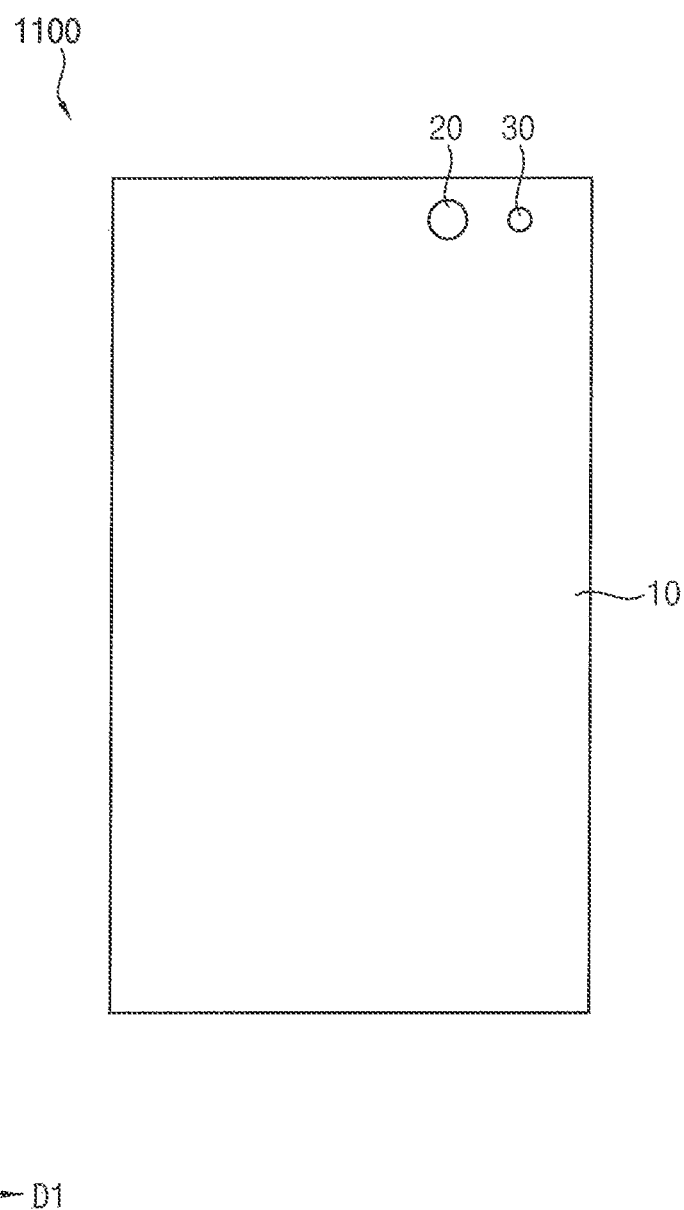
FIG. 19 is a plan view showing an organic light emitting display device according to one or more embodiments of the present disclosure.
Figure 20:
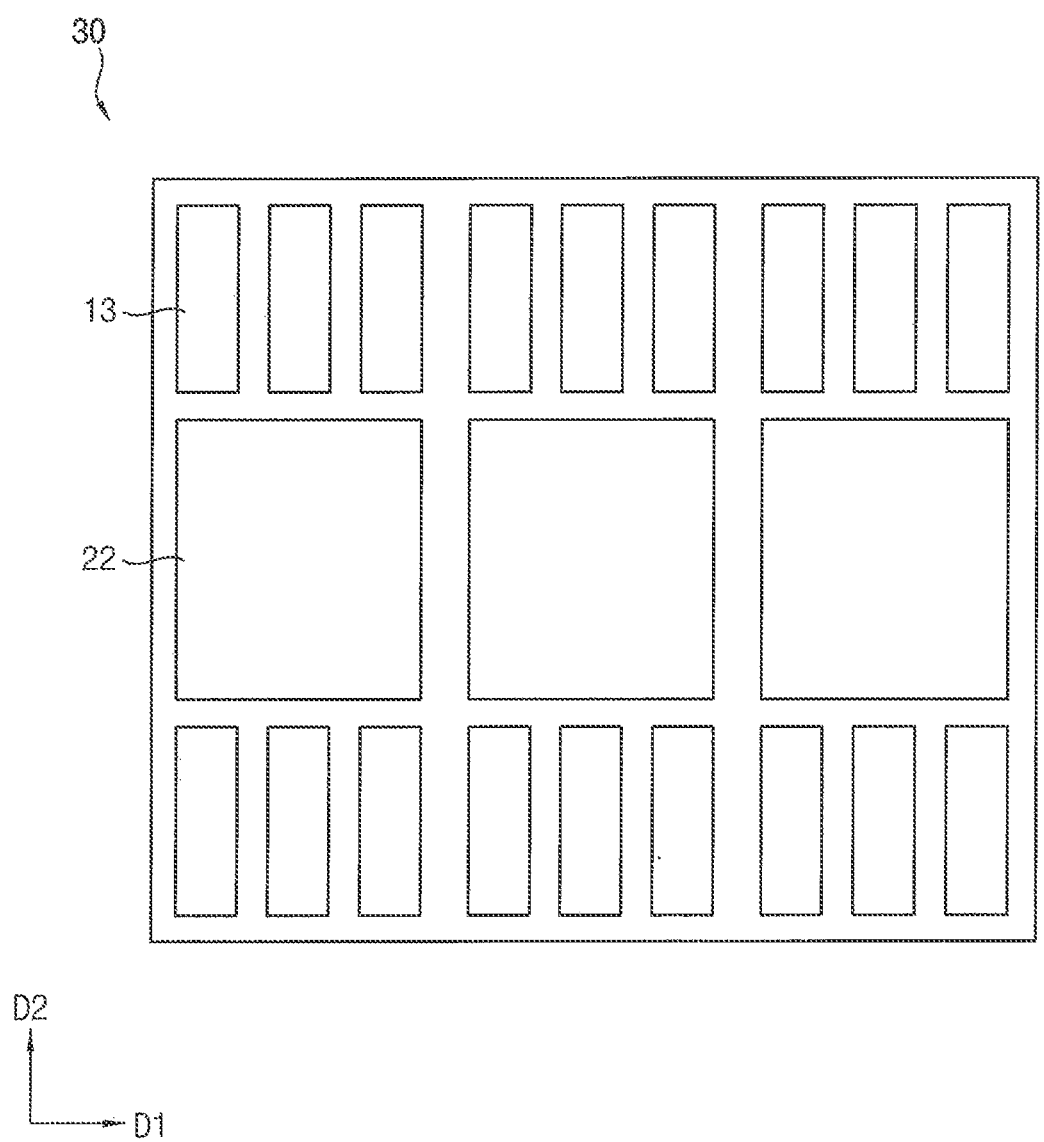
FIG. 20 is a partially enlarged plan view showing a part of a third display area of FIG. 19.
Figure 21:
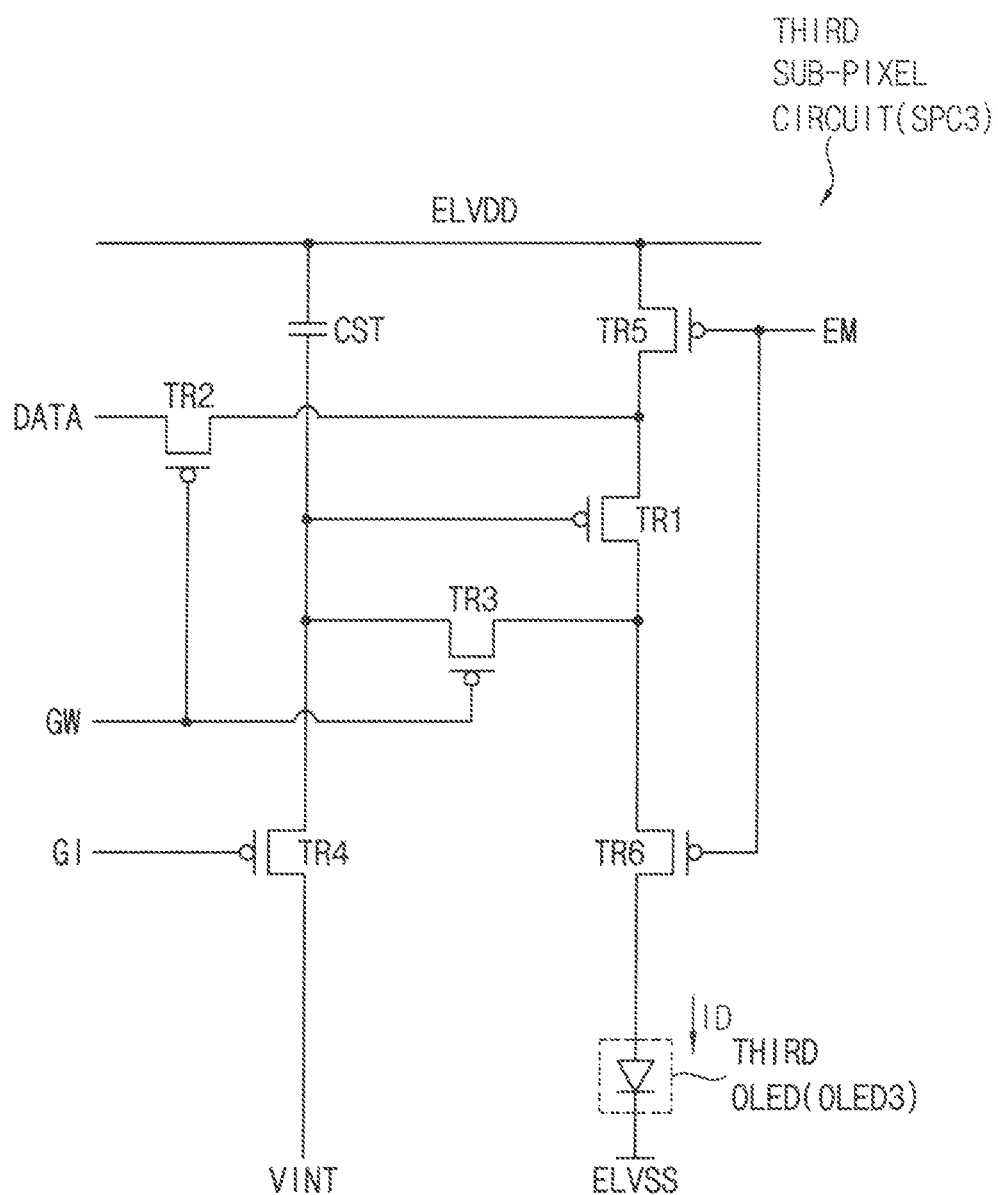
FIG. 21 is a circuit diagram showing a third sub-pixel circuit and a third organic light emitting diode disposed in the third display area of FIG. 20.

FIG. 19 is a plan view showing an organic light emitting display device according to one or more embodiments of the present disclosure, FIG. 20 is a partially enlarged plan view showing a part of a third display area of FIG. 19, and FIG. 21 is a circuit diagram showing a third sub-pixel circuit and a third organic light emitting diode disposed in the third display area of FIG. 20. An organic light emitting display device 1100 illustrated in FIGS. 19 to 21 may have a configuration that is the same or substantially the same as (or similar to) the configuration of the organic light emitting display device 1000 described above with reference to FIGS. 14 to 18. Accordingly, redundant descriptions of the components shown in FIGS. 19 to 21 that are the same or substantially the same as (or similar to) the components described above with reference to FIGS. 14 to 18 may not be repeated.

Referring to FIGS. 4, 5, 15, 16, 19, 20, and 21, the organic light emitting display device 1100 may include a display panel 200, a first optical module (e.g., a first optical sensor or device) 410, a second optical module (e.g., a second optical sensor or device) 420, and the like. In this case, the display panel 200 may include a first sub-pixel circuit SPC1, a first organic light emitting diode OLED1, a second sub-pixel circuit SPC2, a second organic light emitting diode OLED2, a third sub-pixel circuit SPC3, a third organic light emitting diode OLED3, and the like.

In the present embodiment, the display panel 200 may display an image with different resolutions at (e.g., in or on) the first display area 10, the second display area 20, and the third display area 30. For example, the image may be displayed with a first resolution at (e.g., in or on) the first display area 10, the image may be displayed with a second resolution that is lower than the first resolution at (e.g., in or on) the second display area 20, and the image may be displayed with a third resolution between the first resolution and the second resolution at (e.g., in or on) the third display area 30. In other words, the first display area 10 may have the first resolution, the second display area 20 may have the second resolution, and the third display area 30 may have the third resolution.

As shown in FIGS. 4 and 5, the first sub-pixel circuit SPC1 may overlap with the first sub-pixel area 11 of the first display area 10, and the first sub-pixel circuit SPC1 may include the first to seventh transistors TR1, TR2, TR3, TR4, TR5, TR6, and TR7, the storage capacitor CST, the high power supply voltage (ELVDD) wire, the low power supply voltage (ELVSS) wire, the initialization voltage (VINT) wire, the data signal (DATA) wire, the gate signal (GW) wire, the gate initialization signal (GI) wire, the emission control signal (EM) wire, the diode initialization signal (GB) wire, and the like.

As shown in FIGS. 15 and 16, the second sub-pixel circuit SPC2 may overlap with the second sub-pixel area 12 of the second display area 20, and the second sub-pixel circuit SPC2 may induce the first and second transistors TR1 and TR2, the storage capacitor CST, the high power supply voltage (ELVDD) wire, the low power supply voltage (ELVSS) wire, the data signal (DATA) wire, the gate signal (GW) wire, and the like.

In the present embodiment, when compared with the first sub-pixel areas 11 disposed at (e.g., in or on) the first display area 10 of FIG. 4, the second display area 20 may include a relatively smaller number of sub-pixel areas per unit area due to the first transmission areas 21. In other words, the second resolution of the second display area 20 may be lower than the first resolution of the first display area 10.

In the present embodiment the second sub-pixel circuit SPC2 may not be disposed at (e.g., in or on) the first transmission area 21. In other words, the second sub-pixel circuit SPC2 may expose the first transmission area 21.

In addition, the configuration of the first sub-pixel circuit SPC1 and the first organic light emitting diode OLED1 at (e.g., in or on) the first display area 10 may be different from the configuration of the second sub-pixel circuit SPC2 and the second organic light emitting diode OLED2 at (e.g., in or on) the second display area 20. In other words, the number of the transistors included in the first sub-pixel circuit SPC1 at (e.g., in or on) the first sub-pixel area 11 may be greater than the number of the transistors included in the second sub-pixel circuit SPC2 at (e.g., in or on) the second sub-pixel area 12.

When compared with the first transmission area 21 of FIG. 6, the first transmission area 21 of FIG. 15 may have a relatively larger area because the second sub-pixel circuit SPC2 of FIG. 16 does not include the third, fourth, fifth, sixth, and seventh transistors TR3, TR4, TR5, TR6, and TR7, the initialization voltage (VINT) wire, the gate initialization signal (GI) wire, the emission control signal (EM) wire, the diode initialization signal (GB) wire, and the like. In this case, the first optical module 410 may relatively easily capture an image of an object located over the first surface S1 of the display panel 200 due to the first transmission area 21 having the relatively larger area.

As shown in FIGS. 20 and 21, the third sub-pixel circuit SPC3 may overlap with the third sub-pixel area 13 of the third display area 30, and the third sub-pixel circuit SPC3 may include first to sixth transistors TR1, TR2, TR3, TR4, TR5, and TR6, a storage capacitor CST, a high power supply voltage (ELVDD) wire, a low power supply voltage (ELVSS) wire, an initialization voltage (VINT) wire, a data signal (DATA) wire a gate signal (GW) wire, a gate initialization signal (GI) wire, an emission control signal (EM) wire, and the like. In some embodiments, the number of the transistors included in the third sub-pixel circuit SPC3 may be greater than the number of the transistors included in the second sub-pixel circuit SPC2, and may be less than the number of the transistors included in the first sub-pixel circuit SPC1.

In the present embodiment, the third sub-pixel circuit SPC3 may not be disposed at (e.g., in or on) the second transmission area 22. In other words, the third sub-pixel circuit SPC3 may expose the second transmission area 22.

In addition, the configuration of the first sub-pixel circuit SPC1 and the first organic light emitting diode OLED1 at (e.g., in or on) the first display area 10 and the configuration of the second sub-pixel circuit SPC2 and the second organic light emitting diode OLED2 at (e.g., in or on) the second display area 20 may be different from the configuration of the third sub-pixel circuit SPC3 and the third organic light emitting diode OLED3 at (e.g., in or on) the third display area 30. In other words, the number of the transistors included in the third sub-pixel circuit SPC3 at the third sub-pixel area 13 may be less than the number of the transistors included in the first sub-pixel circuit SPC1 at (e.g., in or on) the first sub-pixel area 11, and may be greater than the number of the transistors included in the second sub-pixel circuit SPC2 at (e.g., in or on) the second sub-pixel area 12.

When compared with the first transmission area 21 of FIG. 15, the second transmission area 22 of FIG. 20 may have a relatively smaller area because the third sub-pixel circuit SPC3 of FIG. 21 includes the third, fourth, fifth, and sixth transistors TR3, TR4, TR5, and TR6, the initialization voltage (VINT) wire, the gate initialization signal (GI) wire, the emission control signal (EM) wire, and the like.

In other words, when compared with the second sub-pixel areas 12 disposed at (e.g., in or on) the second display area 20 of FIG. 15, the third display area 30 may include a relatively larger number of sub-pixel areas per unit area due to the second transmission areas 22 having a relatively smaller area. In other words, the third resolution of the third display area 30 may be lower than the first resolution of the first display area 10, and may be higher than the second resolution of the second display area 20.

Figure 22:
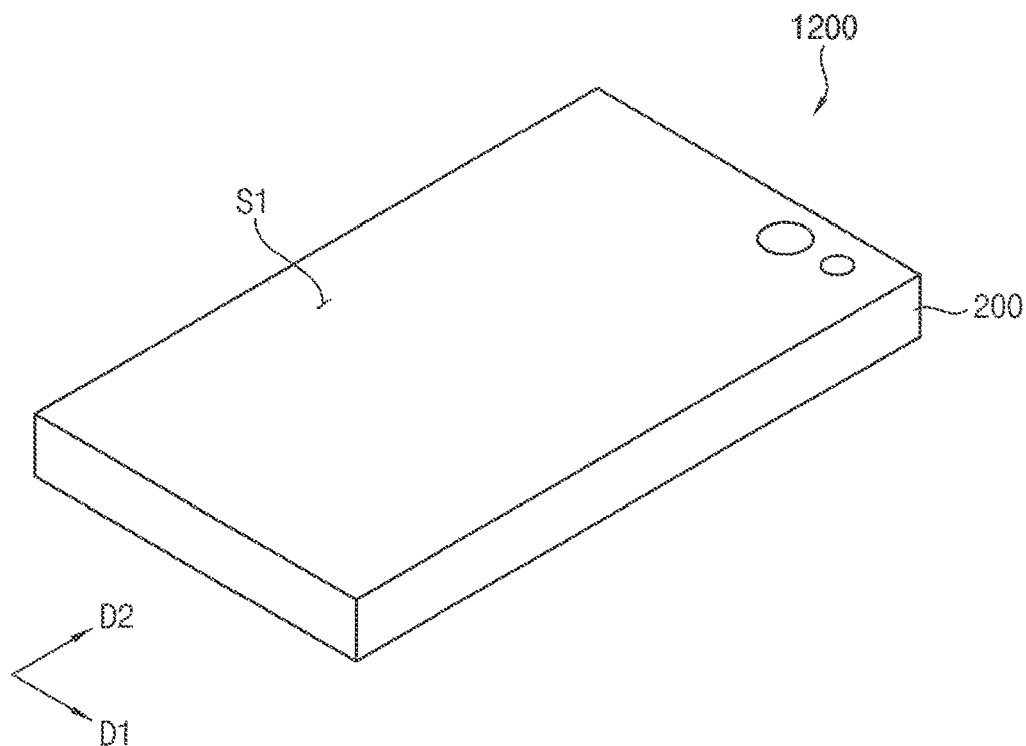
FIG. 22 is a perspective view showing an organic light emitting display device according to one or more embodiments of the present disclosure.
Figure 23:
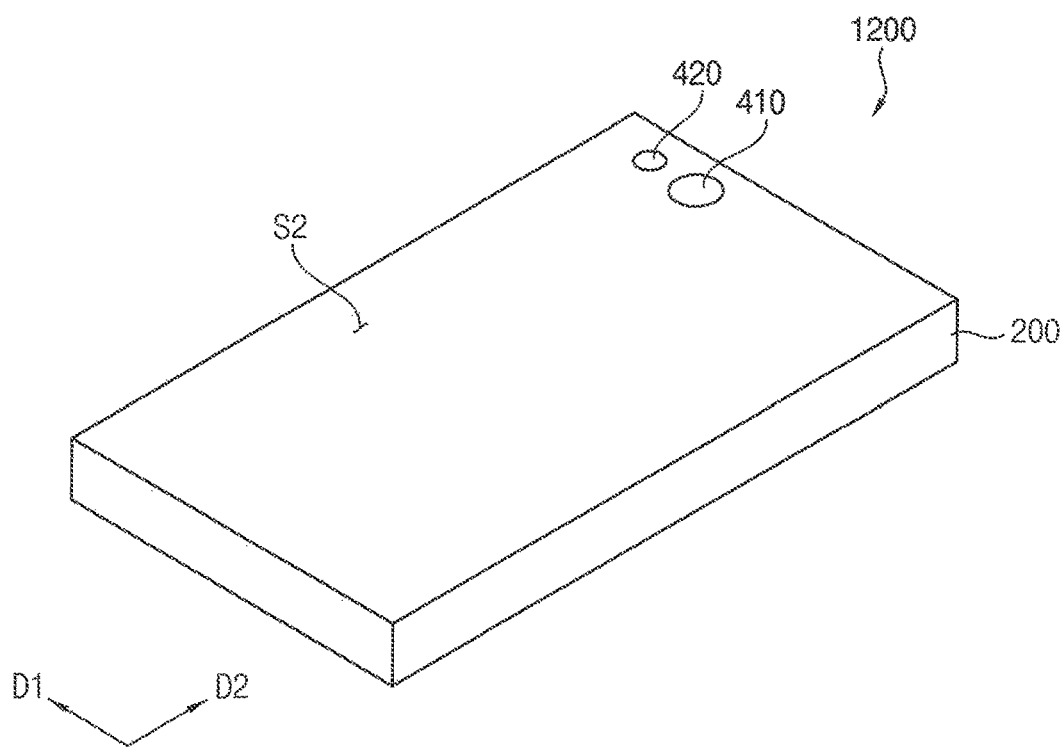
FIG. 23 is a perspective view showing an optical module embedded in the organic light emitting display device of FIG. 22.
Figure 24:
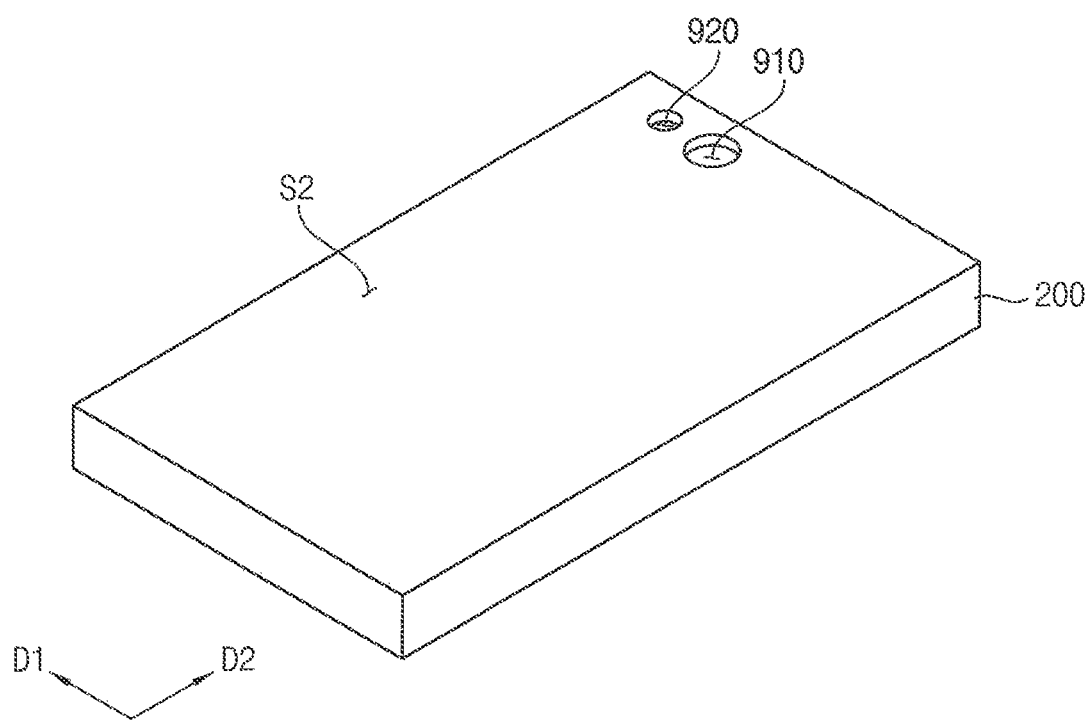
FIG. 24 is a perspective view showing a groove formed in the organic light emitting display device of FIG. 23.

FIG. 22 is a perspective view showing an organic light emitting display device according to one or more embodiments of the present disclosure, FIG. 23 is a perspective view showing an optical module embedded in the organic light emitting display device of FIG. 22, and FIG. 24 is a perspective view showing a groove formed in the organic light emitting display device of FIG. 23. An organic light emitting display device 1200 illustrated in FIGS. 22 to 24 may have a configuration that is the same or substantially the same as (or similar to) the configuration of the organic light emitting display device 100 described above with reference to FIGS. 1 to 13. Accordingly, redundant descriptions of the components shown in FIGS. 22 to 24 that are the same or substantially the same as (or similar to) the components described above with reference to FIGS. 1 to 13 may not be repeated.

Referring to FIGS. 3, 22, 23, and 24, the organic light emitting display device 1200 may include a display panel 200, a first optical module (e.g., a first optical sensor or device) 410, a second optical module (e.g., a second optical sensor or device) 420, and the like. The display panel 200 may nave a first surface S1 for displaying an image, and a second surface S2 opposite to the first surface S1. The display panel 200 may include a first display area 10, a second display area 20, and a third display area 30. In addition, a first groove 910 may be formed in a portion of the second surface S2 of the display panel 200 (or in the substrate 110) that overlaps with the second display area 20, and a second groove 920 may be formed in a portion of the second surface S2 of the display panel 200 that overlaps with the third display area 30. Accordingly, the first optical module 410 may be embedded in the first groove 910, and the second optical module 420 may be embedded in the second groove 920. In this case, the display panel 200, the first optical module 410, and the second optical module 420 may be integrally manufactured.

Figure 25:
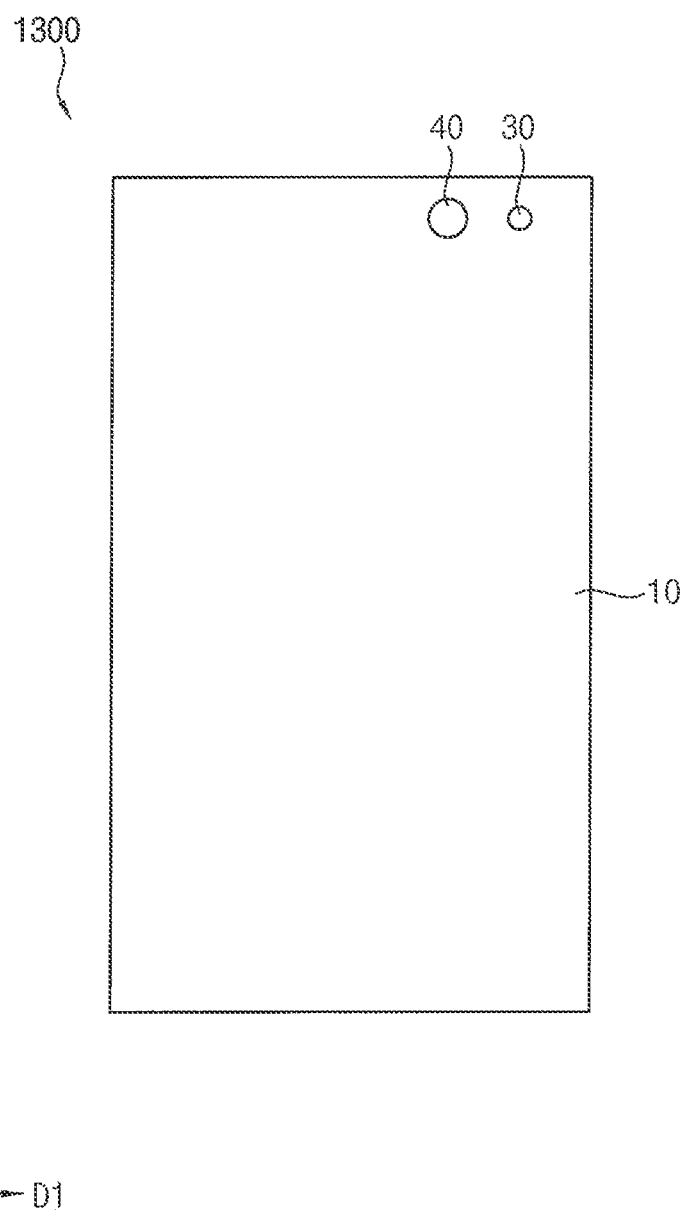
FIG. 25 is a plan view showing an organic light emitting display device according to one or more embodiments of the present disclosure.
Figure 26:
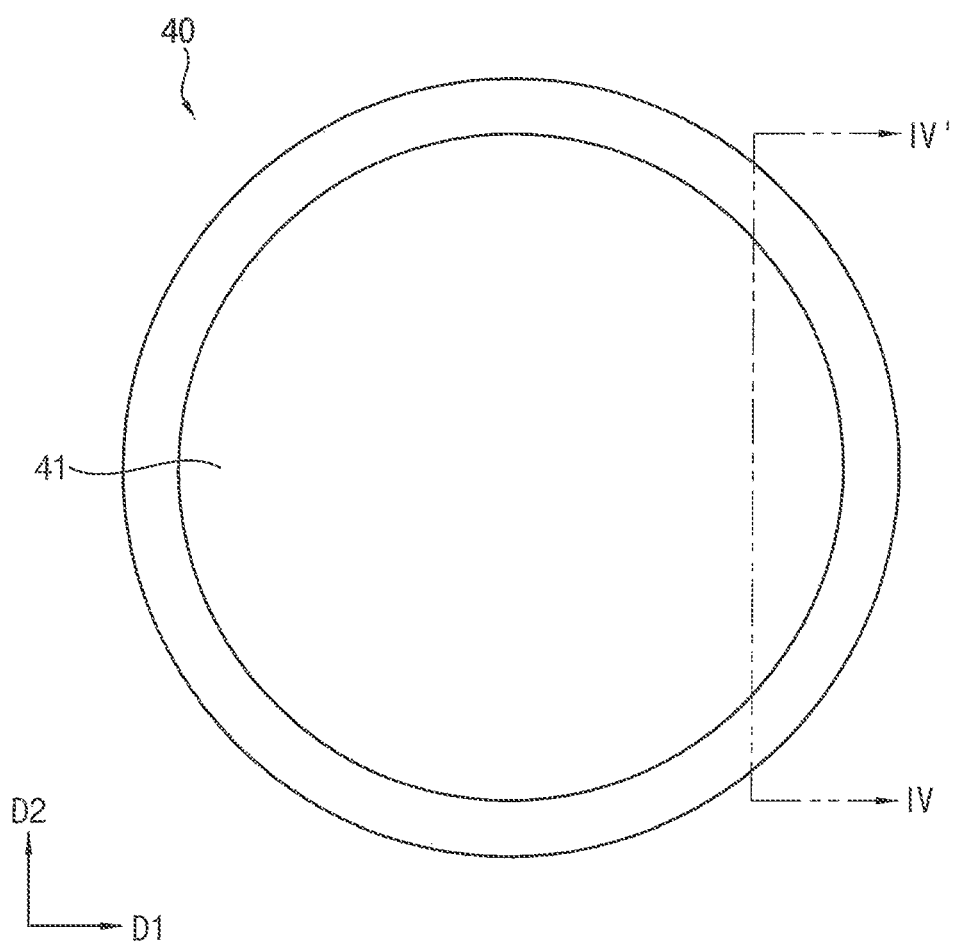
FIG. 26 is an enlarged plan view showing a non-display area of FIG. 25.
Figure 27:
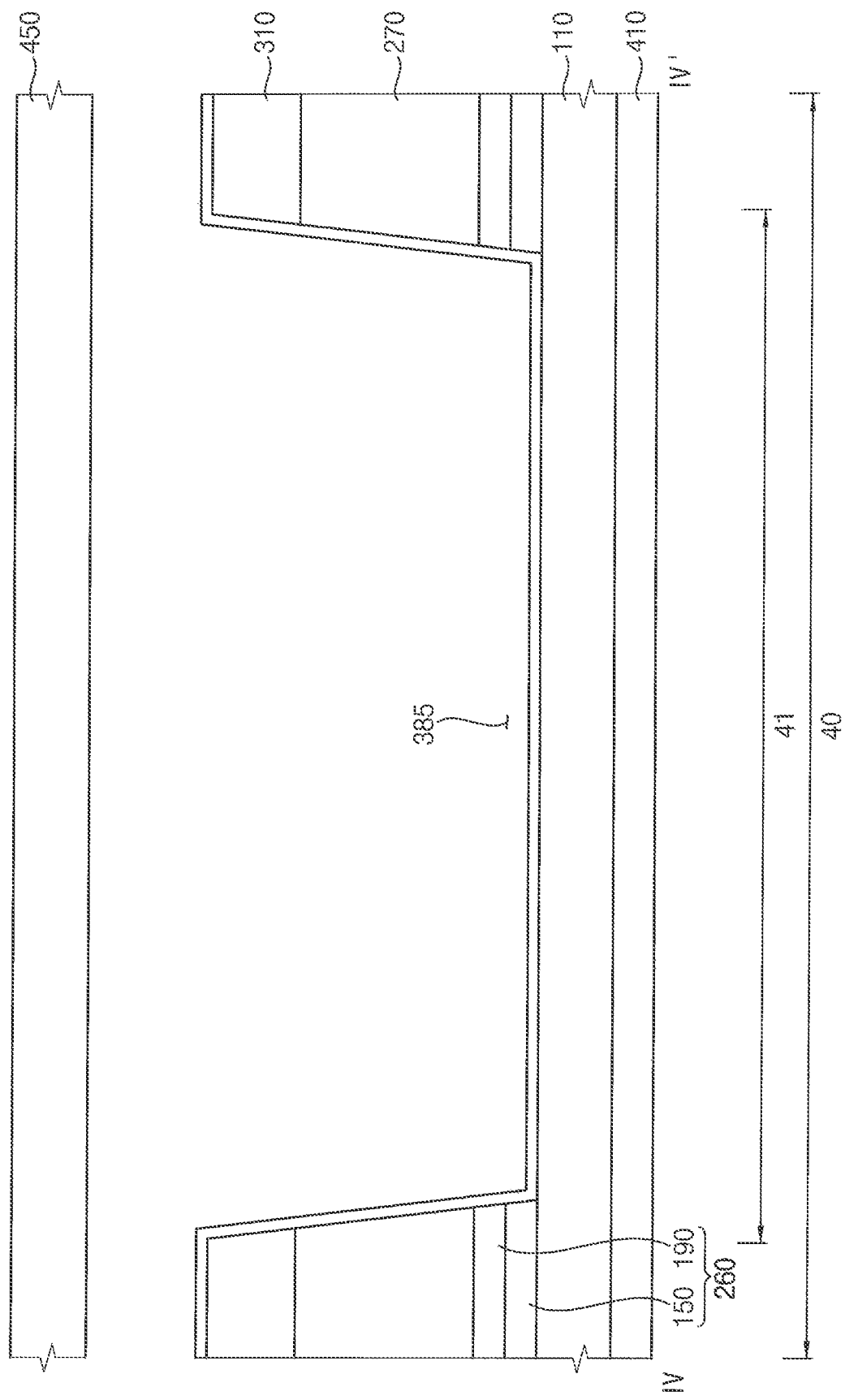
FIG. 27 is a cross-sectional view taken along the line IV-IV' of FIG. 26.

FIG. 25 is a plan view showing an organic light emitting display device according to one or more embodiments of the present disclosure. FIG. 26 is an enlarged plan view showing a non-display area of FIG. 25, and FIG. 27 is a cross-sectional view taken along the line IV-IV' of FIG. 26. An organic light emitting display device 1300 illustrated in FIGS. 25 to 27 may have a configuration that is the same or substantially the same as (or similar to) the configuration of the organic light emitting display device 100 described above with reference to FIGS. 1 to 13. Accordingly, redundant descriptions of the components shown in FIGS. 25 to 27 that are the same or substantially the same as (or similar to) the components described above with reference to FIGS. 1 to 13 may not be repeated.

Referring to FIGS. 25, 26, and 27, the organic light emitting display device 1300 may include a display panel 200, a first optical module (e.g., a first optical sensor or device) 410, a second optical module (e.g., a second optical sensor or device) 420, and the like. The display panel 200 may include a first display area 10, a second display area 30, and a non-display area 40.

The first display area 10 may include a plurality of first sub-pixel areas (e.g., corresponding to the first sub-pixel area 11 of FIG. 4), the second display area 30 may include a plurality of second sub-pixel areas and a plurality of first transmission areas (e.g., corresponding to the third sub-pixel area 13 and the second transmission area 22 of FIG. 9), and the non-display area 40 may include a second transmission area 41 (e.g., corresponding to a second transmission area 41 of FIG. 26). In the present embodiment, the display panel 200 may display an image with different resolutions at (e.g., in or on) the first display area 10 and the second display area 30. For example, the image may be displayed with a first resolution at (e.g., in or on) the first display area 10, and the image may be displayed with a second resolution that is lower than the first resolution at (e.g., in or on) the second display area 30. In other words, the first display area 10 may have the first resolution, and the second display area 30 may have the second resolution. In addition, the image may not be displayed at (e.g., in or on) the non-display area 40. In other words, only a first transmission window 385 may be formed at (e.g., in or on) the non-display area 40.

The first optical module 410 may be disposed on the second surface S2 of the display panel 200 to overlap with the non-display area 40. The first optical module 410 may include a camera module (e.g., a camera, a camera sensor, or a camera device) for capturing an image of an object located over the first surface S1 of the display panel 200.

In this case, the first optical module 410 may relatively easily capture an image of an object located over the first surface S1 of the display panel 200 due to the second transmission area 41 having a relatively larger area.

Although some embodiments have been described, those skilled in the art will readily appreciate that various modifications are possible in the embodiments without departing from the spirit and scope of the present disclosure. Therefore, it is to be understood that the foregoing is illustrative of various embodiments and is not to be construed as limited to the specific embodiments disclosed herein, and that various modifications to the disclosed embodiments, as well as other embodiments, are intended to be included within the spirit and scope of the present disclosure as defined in the appended claims, and their equivalents.

ABILITY OF INDUSTRIAL UTILITY

One or more embodiments of the present disclosure may be applied to various suitable electronic devices including an organic light emitting display device. For example, one or more embodiments of the present disclosure may be applied to various suitable electronic devices, for example, such as a vehicle-display device, a ship-display device, an aircraft-display device, portable communication devices, display devices for display or for information transfer, a medical-display device, and/or the like.

DESCRIPTION OF THE REFERENCE SYMBOLS

10: first display area
11: first sub-display area
12: second sub-display area
13: third sub-display area
20 second display area
21: first transmission area
22: second transmission area
30: third display area
40: non-display area
100, 1100, 1200, 1300: organic light emitting display device
110: substrate
130: first active layer
135: second active layer
150: gate insulating layer
170: first gate electrode
175: second gate electrode 190: interlayer insulating layer
200: display panel
210: first source electrode
215: second source electrode
230: first drain electrode
235: second drain electrode
250: first semiconductor element
255: second semiconductor element
260: insulating layer structure
270: planarization layer
290: first lower electrode
300: first sub-pixel structure
310: pixel defining layer
330: first light emitting layer
340: first upper electrode
345: capping layer
385: first transmission window
395: second transmission window
410: first optical module
420: second optical module
430: third active layer
435: fourth active layer
450: encapsulation substrate
470: third gate electrode
475: fourth gate electrode
510: third source electrode
515: fourth source electrode
530: third drain electrode
535: fourth drain electrode
550: third semiconductor element
555: fourth semiconductor element
600: second sub-pixel structure
630: second light emitting layer
640: second upper electrode
690: second lower electrode
730: fifth active layer
735: sixth active layer
770: fifth gate electrode
775: sixth gate electrode
810: fifth source electrode
815: sixth source electrode
830: fifth drain electrode
835: sixth drain electrode
850: fifth semiconductor element
855: sixth semiconductor element
890: third lower electrode
900: third sub-pixel structure
910: first groove
920: second groove
930: third light emitting layer
940: third upper electrode

The invention claimed is:

1. An organic light emitting display device comprising:
a display panel configured to display an image on a first surface of the display panel, and comprising: a first display area comprising a first sub-pixel area on a first surface of a substrate of the display panel, and having a first resolution; and a second display area comprising a second sub-pixel area and a first transmission area on the first surface of the substrate, and having a second resolution that is lower than the first resolution; and
a first optical sensor on a second surface of the substrate of the display panel opposite to the first surface of the substrate to overlap with the second display area,
wherein the display panel further comprises:
a first sub-pixel circuit at the first display area;
a second sub-pixel circuit at the second display area, the second sub-pixel circuit being different from the first sub-pixel circuit;
a third display area adjacent to the second display area, the third display area comprising a third sub-pixel area and a second transmission area, and having a third resolution between the first resolution and the second resolution; and
a third sub-pixel circuit at the third display area, the third sub-pixel circuit being different from the first and second sub-pixel circuits.

2. The organic light emitting display device of claim 1, wherein a number of transistors constituting the first sub-pixel circuit is greater than a number of transistors constituting the second sub-pixel circuit.

3. The organic light emitting display device of claim 1, wherein the display panel further comprises:
a first sub-pixel structure on the first sub-pixel circuit at the first sub-pixel area, the first sub-pixel structure being electrically connected to the first sub-pixel circuit;
a second sub-pixel structure on the second sub-pixel circuit at the second sub-pixel area, the second sub-pixel structure being electrically connected to the second sub-pixel circuit; and
a first transmission window at the first transmission area adjacent to the second sub-pixel area.

4. The organic light emitting display device of claim 3, wherein the first optical sensor comprises a camera, and
the first optical sensor is configured to recognize an object located over the first surface of the display panel through the first transmission window.

5. The organic light emitting display device of claim 3, wherein the second sub-pixel circuit is not located at the first transmission area.

6. The organic light emitting display device of claim 1, wherein a number of transistors constituting the third sub-pixel circuit is less than a number of transistors constituting the first sub-pixel circuit, and greater than a number of transistors constituting the second sub-pixel circuit.

7. The organic light emitting display device of claim 1, further comprising a second optical sensor on the second surface of the substrate of the display panel to overlap with the third display area.

8. The organic light emitting display device of claim 2, wherein the display panel further comprises:
a third sub-pixel structure on the third sub-pixel circuit at the third sub-pixel area, the third sub-pixel structure being electrically connected to the third sub-pixel circuit; and
a second transmission window at the second transmission area adjacent to the third sub-pixel area.

9. The organic light emitting display device of claim 8, wherein the third sub-pixel circuit is not located at the second transmission area.

10. The organic light emitting display device of claim 8, wherein the second optical sensor comprises at least one of a face recognition sensor, a pupil recognition sensor, an acceleration sensor, a proximity sensor, an infrared sensor, or an illuminance sensor.

11. The organic light emitting display device of claim 7, wherein a size of the first optical sensor is equal to a size of the second display area, and
a size of the second optical sensor is equal to a size of the third display area.

12. The organic light emitting display device of claim 1, wherein an area of the first display area is greater than an area of the second display area.

13. The organic light emitting display device of claim 1, wherein the second display area is located at one end of the first surface of the display panel, and the first display area surrounds the second display area.

14. The organic light emitting display device of claim 1, wherein the first and second sub-pixel circuits have the same configuration as each other.

15. An organic light emitting display device comprising:

a display panel configured to display an image on a first surface of the display panel, the display panel comprising:

a substrate comprising: a first display area comprising a first sub-pixel area, and configured to display the image with a first resolution; and a second display area comprising a second sub-pixel area and a first transmission area, and configured to display the image with a second resolution that is lower than the first resolution;

a first sub-pixel circuit on a first surface of the substrate at the first display area;

a second sub-pixel circuit on the first surface of the substrate at the second display area, and configured to expose the first transmission area;

sub-pixel structures on the first surface of the substrate at the first sub-pixel area and the second sub-pixel area;

a first transmission window on the first surface of the substrate at the first transmission area; and a first optical sensor on a second surface of the substrate of the display panel opposite to the first surface of the substrate to overlap with the second display area, wherein the substrate further comprises:

a third display area adjacent to the second display area, the third display area comprising a third sub-pixel area and a second transmission area, and configured to display the image with the second resolution; and a third sub-pixel circuit at the third display area, and having the same configuration as that of the second sub-pixel circuit.

16. The organic light emitting display device of claim 15, wherein the substrate comprises a first groove at a portion of the second surface that overlaps with the second display area, and the first optical sensor is embedded in the first groove.

17. The organic light emitting display device of claim 15, further comprising:

an insulating layer structure on the substrate;

a planarization layer on the insulating layer structure; and a pixel defining layer on the planarization layer.

18. The organic light emitting display device of claim 17, wherein the insulating layer structure, the planarization layer, and the pixel defining layer have a first opening that exposes the substrate at the first transmission area, and the first opening is defined as the first transmission window.

19. The organic light emitting display device of claim 17, further comprising a capping layer on the pixel defining layer, wherein the capping layer has a first thickness at the first sub-pixel area, and a second thickness that is less than the first thickness at the second sub-pixel area and the first transmission area.

20. The organic light emitting display device of claim 15, wherein a number of transistors constituting the third sub-pixel circuit is equal to a number of transistors constituting the second sub-pixel circuit.

21. The organic light emitting display device of claim 15, further comprising a second optical sensor on the second surface of the substrate of the display panel to overlap with the third display area.

22. The organic light emitting display device of claim 21, wherein the substrate comprises a second groove at a portion of the second surface of the substrate that overlaps with the third display area, and the second optical sensor is embedded in the second groove.

23. The organic light emitting display device of claim 21, wherein the substrate further comprises:

a third sub-pixel structure on the third sub-pixel circuit at the third sub-pixel area, the third sub-pixel structure being electrically connected to the third sub-pixel circuit; and a second transmission window at the second transmission area adjacent to the third sub-pixel area.

24. The organic light emitting display device of claim 23, wherein the third sub-pixel circuit is not located at the second transmission area.

25. The organic light emitting display device of claim 23, wherein an insulating layer structure, a planarization layer, and a pixel defining layer have a second opening that exposes the substrate at the second transmission area, and the second opening is defined as the second transmission window.

26. The organic light emitting display device of claim 25, wherein the first sub-pixel circuit has the same configuration as that of each of the second and third sub-pixel circuits, and a size of the first transmission window is equal to a size of the second transmission window.

27. The organic light emitting display device of claim 25, wherein a configuration of the second sub-pixel circuit is different from a configuration of the third sub-pixel circuit, and a size of the first transmission window is different from a size of the second transmission window.

28. The organic light emitting display device of claim 27, wherein a number of transistors constituting the third sub-pixel circuit is greater than a number of transistors constituting the second sub-pixel circuit.

29. The organic light emitting display device of claim 28, wherein the size of the second transmission window is less than the size of the first transmission window.

30. The organic light emitting display device of claim 15, wherein each of the first and second sub-pixel circuits comprises at least one semiconductor element and at least one capacitor.

31. The organic light emitting display device of claim 15, wherein each of the sub-pixel structures comprises:

a lower electrode on the first and second sub-pixel circuits;

a light emitting layer on the lower electrode; and an upper electrode on the light emitting layer.

32. The organic light emitting display device of claim 31, wherein the upper electrode is not located at the first transmission area.

* * * * *